(12) United States Patent
Kirsch et al.

(10) Patent No.: US 12,424,277 B2
(45) Date of Patent: Sep. 23, 2025

(54) ELECTRONIC SWITCHING DEVICE

(71) Applicant: Merck Patent GmbH, Darmstadt (DE)

(72) Inventors: Peer Kirsch, Darmstadt (DE);
Sebastian Resch, Darmstadt (DE);
Henning Seim, Darmstadt (DE); Itai Lieberman, Darmstadt (DE); Shintaro Arai, Tokyo (JP); Marc Tornow, Munich (DE); Takuya Kamiyama, Munich (DE); Julian Dlugosch, Munich (DE); Mansour Moinpour, Wilmington, DE (US)

(73) Assignee: Merck Patent GmbH, Darmstadt (DE)

( * ) Notice: Subject to any disclaimer, the term of this patent is extended or adjusted under 35 U.S.C. 154(b) by 730 days.

(21) Appl. No.: 17/770,311

(22) PCT Filed: Oct. 20, 2020

(86) PCT No.: PCT/EP2020/079417
§ 371 (c)(1),
(2) Date: Apr. 20, 2022

(87) PCT Pub. No.: WO2021/078699
PCT Pub. Date: Apr. 29, 2021

(65) Prior Publication Data
US 2023/0010658 A1    Jan. 12, 2023

(30) Foreign Application Priority Data
Oct. 21, 2019    (EP) .................................... 19204381

(51) Int. Cl.
*G11C 13/00* (2006.01)
*C07F 9/38* (2006.01)
(Continued)

(52) U.S. Cl.
CPC ........ *G11C 13/0014* (2013.01); *C07F 9/3808* (2013.01); *G11C 13/02* (2013.01);
(Continued)

(58) Field of Classification Search
None
See application file for complete search history.

(56) References Cited

U.S. PATENT DOCUMENTS

| 8,975,622 B2 | 3/2015 | Hayashi |
| 10,741,778 B2 | 8/2020 | Kirsch |

(Continued)

FOREIGN PATENT DOCUMENTS

| DE | 102017005884 A1 | 1/2018 |
| JP | H08-127556 A | 5/1996 |

(Continued)

OTHER PUBLICATIONS

Seitz et al., "Effect of Doping on Electronic Transport through Molecular Monolayer Junctions" J. Am. Chem. Soc. 2007, 129, 7494-7495.

(Continued)

*Primary Examiner* — Anthony Ho
(74) *Attorney, Agent, or Firm* — Millen, White, Zelano & Branigan, P.C.; Brion P. Heaney

(57) ABSTRACT

The present invention relates to an electronic switching device comprising an organic molecular layer in contact with a metal nitride electrode for use in memory, sensors, field-effect transistors or Josephson junctions. More particularly, the invention is included in the field of random access non-volatile memristive memories (RRAM). The invention thus further relates to an electronic component comprising a crossbar array comprising a multitude of said electronic switching devices.

20 Claims, 6 Drawing Sheets

(51) Int. Cl.
  *G11C 13/02* (2006.01)
  *H10K 10/00* (2023.01)
  *H10K 10/50* (2023.01)
  *H10K 10/82* (2023.01)
  *H10K 19/00* (2023.01)
  *H10K 85/60* (2023.01)

(52) U.S. Cl.
  CPC .......... *H10K 10/50* (2023.02); *H10K 10/701* (2023.02); *H10K 10/82* (2023.02); *H10K 19/202* (2023.02); *H10K 85/60* (2023.02); *H10K 85/6574* (2023.02); *H10K 85/6576* (2023.02)

(56) References Cited

U.S. PATENT DOCUMENTS

| | | |
|---|---|---|
| 11,063,227 B2 | 7/2021 | Kirsch |
| 2005/0099209 A1 | 5/2005 | Luyken et al. |
| 2014/0008601 A1 | 1/2014 | Nishizawa et al. |
| 2015/0083988 A1 | 3/2015 | Tanaka et al. |
| 2016/0027946 A1 | 1/2016 | Tokuhisa |
| 2019/0284474 A1 | 9/2019 | Song |
| 2019/0312216 A1* | 10/2019 | Kirsch .................. C07F 9/3839 |
| 2021/0257569 A1 | 8/2021 | Kirsch et al. |

FOREIGN PATENT DOCUMENTS

| | | |
|---|---|---|
| JP | 2014066761 A | 4/2014 |
| WO | 2012/127542 A1 | 9/2012 |
| WO | 2014167885 A1 | 10/2014 |
| WO | 2016/110301 A1 | 7/2016 |
| WO | 2018/007337 A2 | 1/2018 |
| WO | 2018015323 A2 | 1/2018 |
| WO | 2019238649 A1 | 12/2019 |

OTHER PUBLICATIONS

Chiechi et al., "Eutectic Gallium-Indium (EGaIn): A Moldable Liquid Metal for Electrical Characterization of Self-Assembled Monolayers**" Angew. Chem. Int. Ed. 2008, 47, 142-144.

Lovrincic et al., "A New Route to Nondestructive Top-Contacts for Molecular Electronics on Si: Pb Evaporated on Organic Monolayers" J. Phys. Chem. Lett. 2013, 4, 426-430.

Vilan et al., "Large-Area, Ensemble Molecular Electronics: Motivation and Challenges" Chem. Rev. 2017, 117, 4248-4286.

International Search Report PCT/EP2020/079417 dated Feb. 8, 2021 (pp. 1-4).

* cited by examiner

ELECTRONIC SWITCHING DEVICE

The present invention relates to an electronic switching device, in particular to tunnel junctions, comprising an organic molecular layer in contact with a metal nitride electrode for use in memory, sensors, field-effect transistors or Josephson junctions. More particularly, the invention is included in the field of random access non-volatile memristive memories (RRAM).

Tunnel junctions are used for many applications in electronics industry, ranging from superconducting Josephson junctions to tunnel diodes. They require a very thin dielectric material as insulator. One of the most cost-effective ways to generate such an insulating layer with single digit nanometer thickness is by using self-assembled monolayers (SAMs).

In computer technology, storage media are required which allow rapid writing and reading access to information stored therein. Solid-state memories or semiconductor memories allow particularly fast and reliable storage media to be achieved, since absolutely no moving parts are necessary. At present, use is mainly made of dynamic random access memory (DRAM). DRAM allows rapid access to the stored information, but this information has to be refreshed regularly, meaning that the stored information is lost when the power supply is switched off.

The prior art also discloses non-volatile semiconductor memories, such as flash memory or magnetoresistive random access memory (MRAM), in which the information is retained even after the power supply has been switched off. A disadvantage of flash memory is that writing access takes place comparatively slowly and the memory cells of the flash memory cannot be erased ad infinitum. The lifetime of flash memory is typically limited to a maximum of one million read/write cycles. MRAM can be used in a similar way to DRAM and has a long lifetime, but this type of memory has not been able to establish itself owing to the difficult production process.

A further alternative is memory which works on the basis of memristors. The term memristor is a contraction of the words "memory" and "resistor" and denotes a component which is able to change its electrical resistance reproducibly between a high and a low electrical resistance. The respective state (high resistance or low resistance) is retained even without a supply voltage, meaning that non-volatile memories can be achieved with memristors. Crossbar arrays of memristors may be used in a variety of applications, including non-volatile solid state memory, programmable logic, signal processing, control systems, pattern recognition, and other applications. A memristive cross-bar array includes a number of row lines, a number of column lines intersecting the row lines to form a number of junctions, and a number of resistive memory devices coupled between the row lines and the column lines at the junctions.

WO 2012/127542 A1 and US 2014/008601 A1, for example, disclose organic molecular memories which have two electrodes and an active region which is arranged between the two electrodes. The active region has a molecular layer of electrically conductive aromatic alkynes, whose conductivity can be changed under the influence of an electric field. Similar components based on redox-active bipyridinium compounds are proposed in US 2005/0099209 A1.

The known memories based on a change in conductivity or resistance have the disadvantage that the free-radical intermediates formed by the flow of current through the molecules of the molecular layer are in principle susceptible to degradation processes, which has an adverse effect on the lifetime of the components.

In WO 2018/007337 A2 an improved switching layer is described that makes use of a non-redox active molecular layer comprising dipolar compounds linked to a substrate via an aliphatic spacer group where the compounds are reversibly switched by application of an electric field which causes re-orientation of the molecular dipole and thus enabling a low-resistive state and a high-resistive state depending on the respective orientation of the molecules.

In order to obtain electrically switchable tunnel junctions from organic compounds with a conformationally flexible dipole, a molecular layer enclosed as a sandwich between two conductive electrodes is required. The deposition of this molecular layer onto electrodes is achieved either by spin-coating or by dip-coating from an organic solvent. The basic principle of the resulting memory device is described in WO 2016/110301 A1 and WO 2018/007337 A2.

Providing these molecular layers with a metal top contact is very challenging and often results in the formation of short circuits or artifacts due to degradation of the molecular layer. Most organic materials are relatively heat-sensitive and sensitive towards the process conditions and reagents used during typical CMOS processes.

Typically, molecular layers or SAM are contacted either by liquid metals materials (Hg, InGa eutectic) (cf. a) O. Seitz, A. Vilan, H. Cohen, C. Chan, J. Hwang, A. Kahn, D. Cahen, J. Am. Chem. Soc. 2007, 129, 7494-7495; b) R. C. Chiechi, E. A. Weiss, M. D. Dickey, G. M. Whitesides, Angew. Chem. Int. Ed. 2008, 47, 142-144) or by metals such as for example Pb, Ti, Al, Au which are deposited by (ultra-slow) evaporation (cf. R. Lovrincic, O. Kraynis, R. Har-Lavan, A.-E. Haj-Yahya, W. Li, A. Vilan, D. Cahen, J. Phys. Chem. Lett. 2013, 4, 426-430; Ayelet Vilan, Dinesh Aswal, and David Cahen, Chem. Rev. 2017, 117, 4248-4286). While the liquid metals are not capable of being integrated, evaporation of metals is often not desirable from an industrial point of view because it is incompatible with standard CMOS processes.

It is an object of the present invention to provide electronic components comprising a conductive top contact for organic molecular layers suitable for use in for example memristive devices, which do not have the above mentioned disadvantages and which bring improvements, in particular, with respect to one or more of the following properties:

In order to increase reliability the contact has to form a barrier for the migration of atoms or ions from the electrode into or through the molecular layer;

Deposition at low temperature and without the use of aggressive chemical reagents (e.g., reactive plasma);

good adhesion to the molecular layer which typically has a low surface energy

Patternable by lift-off (low resolution) or by dry etching (high resolution);

Stable in ambient condition (humidity, light, oxidation).

To solve the problem there is provided a switching device comprising, in this sequence, a first electrode,
a molecular layer bonded to the first electrode,
a second electrode,
where the first and second electrodes comprise a metal nitride, and
where the molecular layer is essentially formed from one or more, preferably one, compounds selected from the group of compounds of the formulae IA, IB and IC:

$$R^{1A}\text{-}(A^1\text{-}Z^1)_r\text{—}B^1\text{—}(Z^2\text{-}A^2)_s\text{-Sp}^4\text{-G} \quad \text{(IA)}$$

$$D^1\text{-}Z^D\text{-}(A^1\text{-}Z^1)_r\text{—}B^1\text{—}(Z^2\text{-}A^2)_s\text{-Sp-G} \quad \text{(IB)}$$

$$R^{1C}\text{-}(A^1\text{-}Z^1)_r\text{—}B^1\text{—}Z^L\text{-}A^{2C}\text{-}(Z^3\text{-}A^3)_s\text{-G} \quad \text{(IC)}$$

in which $R^{1A}$, $R^{1C}$ denote straight chain or branched alkyl or alkoxy each having 1 to 20 C atoms, where one or more $CH_2$ groups in these radicals may each be replaced, independently of one another, by —C≡C—, —CH=CH—,

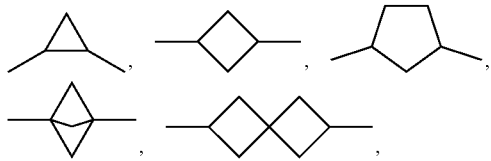

—O—, —S—, —CF$_2$O—, —OCF$_2$—, —CO—O—, —O—CO—, —SiR$^o$R$^{oo}$—, —NH—, —NR$^o$— or —SO$_2$— in such a way that O atoms are not linked directly to one another, and in which one or more H atoms may be replaced by halogen, CN, SCN or SF$_5$, where $R^{1C}$ alternatively denotes a group $D^1$-$Z^D$, $Z^D$ has one of the meanings of $Z^1$, $Z^2$ and $Z^3$ or denotes a spacer group, $Z^1$, $Z^2$, $Z^3$ on each occurrence, identically or differently, denote a single bond, —CF$_2$O—, —OCF$_2$—, —CF$_2$S—, —SCF$_2$—, —CH$_2$O—, —OCH$_2$—, —C(O)O—, —OC(O)—, —C(O)S—, —SC(O)—, —(CH$_2$)$_{n1}$—, —(CF$_2$)$_{n2}$—, —CF$_2$—CH$_2$—, —CH$_2$—CF$_2$—, —CH=CH—, —CF=CF—, —CF=CH—, —CH=CF—, —(CH$_2$)$_{n3}$O—, —O(CH$_2$)$_{n4}$—, —C≡C—, —O—, —S—, —CH=N—, —N=CH—, —N=N—, —N=N(O)—, —N(O)=N— or —N=C—C=N—, n1, n2, n3, n4 identically or differently, are 1, 2, 3, 4, 5, 6, 7, 8, 9 or 10, $Z^L$ denotes —O—, —S—, —CH$_2$—, —C(O)—, —CF$_2$—, —CHF—, —C(R$^x$)$_2$—, —S(O)—, —SO$_2$—, $R^o$, $R^{oo}$, identically or differently, denote an alkyl or alkoxy radical having 1 to 15 C atoms, in which, in addition, one or more H atoms may be replaced by halogen, $D^1$ denotes a diamondoid radical, preferably derived from a lower diamondoid, very preferably selected from the group consisting of adamantyl, diamantyl, and triamantyl, in which one or more H atoms can be replaced by F, in each case optionally fluorinated alkyl, alkenyl or alkoxy having up to 12 C atoms, in particular

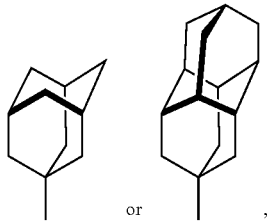

$A^1$, $A^2$, $A^3$ on each occurrence, identically or differently, denote an aromatic, heteroaromatic, alicyclic or heteroaliphatic ring having 4 to 25 ring atoms, which may also contain condensed rings and which may be mono- or polysubstituted by Y, $A^{2C}$ denotes an aromatic or heteroaromatic ring having 5 to 25 ring atoms, which may also contain condensed rings and which may be mono- or polysubstituted by $Y^C$, Y on each occurrence, identically or differently, denotes F, Cl, CN, SCN, SF$_5$ or straight-chain or branched, in each case optionally fluorinated alkyl, alkoxy, alkylcarbonyl, alkoxycarbonyl, alkylcarbonyloxy or alkoxycarbonyloxy having 1 to 12 C atoms, preferably F or Cl, $Y^C$ on each occurrence, identically or differently, denotes F, Cl, CN, SCN, SF$_5$ or straight-chain or branched, in each case optionally fluorinated alkyl, alkoxy, alkylcarbonyl, alkoxycarbonyl, alkylcarbonyloxy or alkoxycarbonyloxy having 1 to 12 C atoms, or cycloalkyl or alkylcycloalkyl each having 3 to 12 C atoms, preferably methyl, ethyl, isopropyl, cyclopropyl, cyclobutyl, cyclopentyl, cyclohexyl, trifluoromethyl, methoxy or trifluoromethoxy, $B^1$ denotes

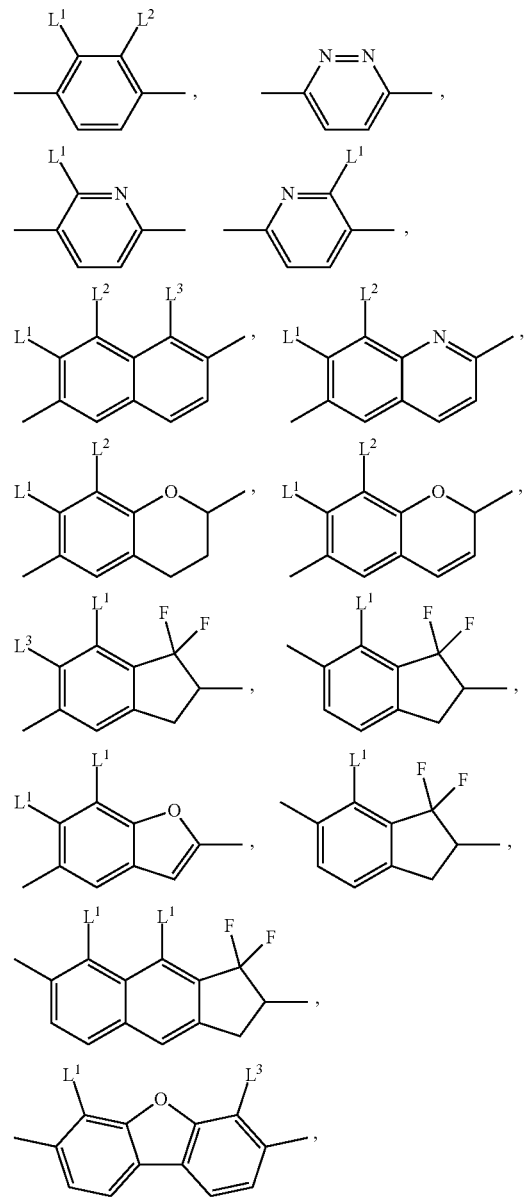

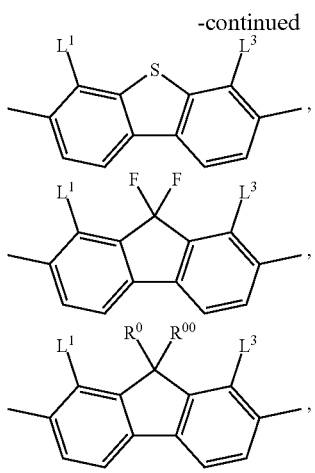

in which $R^0$ and $R^{00}$ denote F or alkyl having 1 to 6 C atoms,

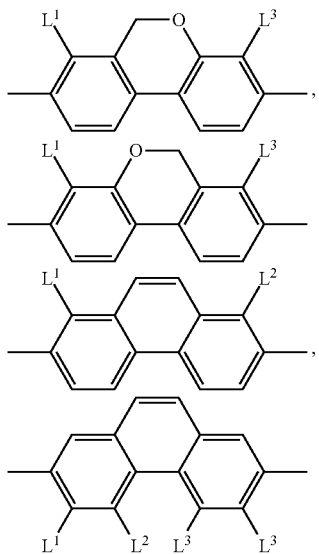

where the groups may be oriented in both directions,
$L^1$ to $L^5$, independently of one another, denote F, Cl, Br, I, CN, $SF_5$, $CF_3$ or $OCF_3$, preferably $CF_3$, Cl or F, where $L^3$ may alternatively also denote H,
$Sp^A$ denotes a spacer group or a single bond,
Sp denotes a spacer group
G denotes —OH, —CH($CH_2OH$)$_2$, —C($CH_2OH$)$_3$, —SH, —$SO_2OH$, —OP(O)(OH)$_2$, —PO(OH)$_2$, —C(OH)(PO(OH)$_2$)$_2$, —COOH, —Si(OR$^x$)$_3$ or —SiCl$_3$, —$SO_2OR^V$, —OP(O)(OR$^V$)$_2$, —PO(OR$^V$)$_2$, —C(OH)(PO(OR$^V$)$_2$)$_2$, —COOR$^V$, —Si(OR$^V$)$_3$, preferably —PO(OH)$_2$ or —C(OH)(PO(OH)$_2$)$_2$, very preferably —PO(OH)$_2$
$R^V$ denotes secondary or tertiary alkyl having 1 to 20 C atoms, preferably secondary or tertiary alkyl having 3 to 10 C atoms,
$R^x$ denotes straight-chain or branched alkyl having 1 to 6 C atoms, and
r, s on each occurrence, identically or differently, are 0, 1 or 2.

The invention furthermore relates to a process for the production of the switching device according to the invention comprising at least the following steps:

i. production of a first electrode comprising a metal nitride having a surface
ii. deposition of a molecular layer comprising one or more compounds selected from the group of compounds of the formulae IA, IB and IC defined above onto the surface of the first electrode,
iii. application of a second electrode comprising a metal nitride.

The invention furthermore relates to a method for operating the electronic component according to the invention, characterised in that a switching device of the electronic component is switched into a state of high electrical resistance by setting a corresponding first electrode to a first electrical potential and setting a corresponding second electrode to a second electrical potential, where the value of the voltage between the two electrodes is greater than a first switching voltage and the first potential is greater than the second potential, a switching device of the electronic component is switched into a state of low electrical resistance by setting a corresponding first electrode to a third electrical potential and setting a corresponding second electrode to a fourth electrical potential, where the value of the voltage between the two electrodes is greater than a second switching voltage and the fourth potential is greater than the third potential, and the state of a switching device is determined by applying a reading voltage whose value is smaller than the first and second switching voltages between corresponding electrodes and measuring the current flowing.

According to another aspect of the present invention there is provided an electronic component where the component is a memristive crossbar array comprising a multitude of switching devices according to the present invention.

The resulting devices can be used in memory, sensors, field-effect transistors or Josephson junctions, preferably in resistive memory devices.

The present invention further relates to the use of the switching devices in memory, sensors, field-effect transistors or Josephson junctions.

The switching devices according to the invention are suitable for use in electronic components, in particular in memory, sensors, field-effect transistors or Josephson junctions, very particularly in memristive components such as memristive crossbar-arrays, which exhibit the advantageous properties indicated above.

The switching device according to the invention is distinguished by high robustness against degradation by ion migration (e.g., by the formation of ohmic conductive channels) and has the advantage that non-conductive interlayers, e.g. aluminium oxide, that would reduce the tunnel current, are unnecessary. The switching device is further distinguished by high current densities and low switching voltages. The switching device exhibits high reliability and endurance. Furthermore, the memory window is advantageously large and improved over the devices known from prior art. The electrode materials (metal nitrides) used in the device according to the invention are highly compatible with devices and fabrication processes of the semiconductor industry and are surprisingly well suitable for the formation of a stable and homogeneous molecular monolayer.

Figure 1A:
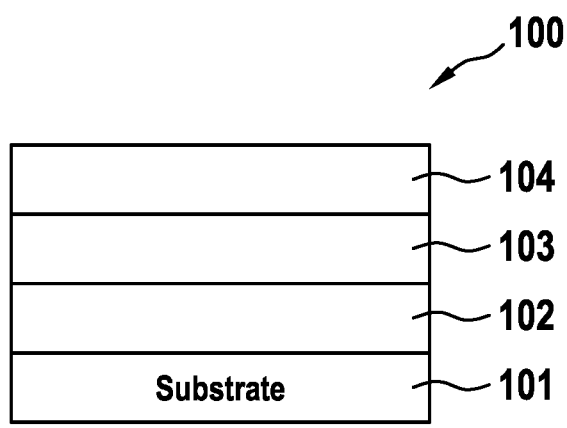
FIG. 1A shows a schematic illustration of the layer structure of a first embodiment of the electronic switching device.

In claim 1, the expression "essentially formed from" is taken to mean that specific further compounds can be present in the compounds that are used for the formation of the molecular layer, namely those not materially affecting the essential characteristics of the molecular layer.

As used herein, the term "RRAM" or "resistive memory device" is taken to mean a memory device that uses a molecular switching layer whose resistance can be can be controlled by applying a voltage.

Low resistance state or ON state of the resistive memory device is taken to mean a state in which the resistive memory device has a low electrical resistance. High resistance state or OFF state of the resistive memory device is taken to mean a state in which the resistive memory device has a high resistance.

Memory window is taken to mean an interval of resistance values having a lower bound and an upper bound.

States having a resistance lower than the lower bound of this interval are considered as ON states.

States having a resistance higher than the upper bound of this interval are considered as OFF states.

The term "diamondoids" refers to substituted and unsubstituted cage compounds of the adamantane series including adamantane, diamantane, triamantane, tetramantanes, pentamantanes, hexamantanes, heptamantanes, octamantanes, and the like, including all isomers and stereoisomers thereof. The compounds have a "diamondoid" topology, which means their carbon atom arrangement is superimposable on a fragment of a face centered cubic diamond lattice. Substituted diamondoids from the first of the series are preferable with 1 to 4 independently-selected alkyl or alkoxy substituents. Diamondoids include "lower diamondoids" and "higher diamondoids," as these terms are defined herein, as well as mixtures of any combination of lower and higher diamondoids. The term "lower diamondoids" refers to adamantane, diamantane and triamantane and any and/or all unsubstituted and substituted derivatives of adamantane, diamantane and triamantane. These lower diamondoid components show no isomers or chirality and are readily synthesized, distinguishing them from "higher diamondoids." The term "higher diamondoids" refers to any and/or all substituted and unsubstituted tetramantane components; to any and/or all substituted and unsubstituted pentamantane components; to any and/or all substituted and unsubstituted hexamantane components; to any and/or all substituted and unsubstituted heptamantane components; to any and/or all substituted and unsubstituted octamantane components; as well as mixtures of the above and isomers and stereoisomers of tetramantane, pentamantane, hexamantane, heptamantane, and octamantane. Adamantane chemistry has been reviewed by Fort, Jr. et al. in "Adamantane: Consequences of the Diamondoid Structure," Chem. Rev. vol. 64, pp. 277-300 (1964). Adamantane is the smallest member of the diamondoid series and may be thought of as a single cage crystalline subunit. Diamantane contains two subunits, triamantane three, tetramantane four, and so on. While there is only one isomeric form of adamantane, diamantane, and triamantane, there are four different isomers of tetramantane, (two of which represent an enantiomeric pair), i.e., four different possible ways or arranging the four adamantane subunits. The number of possible isomers increases non-linearly with each higher member of the diamondoid series, pentamantane, hexamantane, heptamantane, octamantane, etc. Adamantane, which is commercially available, has been studied extensively. The studies have been directed toward a number of areas, such as thermodynamic stability, functionalization, and the properties of adamantane-containing materials. For instance, Schreiber et al., New J. Chem., 2014, 38, 28-41 describes the synthesis and application of functionalized diamondoids to form large area SAMs on silver and gold surfaces. In K. T. Narasimha et al., Nature Nanotechnology 11, March 2016 page 267-273, monolayers of diamondoids are described to effectively confer enhanced field emission properties to metal surfaces due to a significant reduction of the work function of the metal.

As used herein, an anchor group is a functional group by means of which a compound is adsorbed onto or bonded to the surface of the substrate by physisorption, chemisorption or by chemical reaction. This chemical reaction includes the transformation of a precursor of an anchor group in situ, for example on the surface of a substrate or electrode.

A spacer group in the sense of the present invention is a flexible chain between dipolar moiety and anchor group which causes a separation between these sub-structures and, owing to its flexibility, at the same time improves the mobility of the dipolar moiety after bonding to a substrate.

The spacer group can be branched or straight chain. Chiral spacers are branched and optically active and non racemic.

Herein, alkyl is straight-chain or branched and has 1 to 15 C atoms, is preferably straight-chain and has, unless indicated otherwise, 1, 2, 3, 4, 5, 6 or 7 C atoms and is accordingly preferably methyl, ethyl, propyl, butyl, pentyl, hexyl or heptyl.

Herein, an alkoxy radical is straight-chain or branched and contains 1 to 15 C atoms. It is preferably straight-chain and has, unless indicated otherwise, 1, 2, 3, 4, 5, 6 or 7 C atoms and is accordingly preferably methoxy, ethoxy, propoxy, butoxy, pentoxy, hexoxy or heptoxy.

Herein, an alkenyl radical is preferably an alkenyl radical having 2 to 15 C atoms, which is straight-chain or branched and contains at least one C—C double bond. It is preferably straight-chain and has 2 to 7 C atoms. Accordingly, it is preferably vinyl, prop-1- or -2-enyl, but-1-, -2- or -3-enyl, pent-1-, -2-, -3- or -4-enyl, hex-1-, -2-, -3-, -4- or -5-enyl, hept-1-, -2-, -3-, -4-, -5- or -6-enyl. If the two C atoms of the C—C double bond are substituted, the alkenyl radical can be in the form of E and/or Z isomer (trans/cis). In general, the respective E isomers are preferred. Of the alkenyl radicals, prop-2-enyl, but-2- and -3-enyl, and pent-3- and -4-enyl are particularly preferred.

Herein alkynyl is taken to mean an alkynyl radical having 2 to 15 C atoms, which is straight-chain or branched and contains at least one C—C triple bond. 1- and 2-propynyl and 1-, 2- and 3-butynyl are preferred.

The first and second electrodes comprise, preferably consist of a metal nitride selected from chromium nitride (CrN), hafnium nitride (HfN), molybdenum nitride (MoN), niobium nitride (NbN), titanium nitride (TiN), tantalum nitride (TaN), tungsten nitride (WN), tungsten carbide nitride (WCN), vanadium nitride (VN) and zirconium nitride (ZrN).

More preferably, the first electrode consist of a metal nitride selected from CrN, HfN, MoN, NbN, TiN, TaN, WN, WCN, VN and ZrN, and the second electrode consists of TiN.

Very preferably, the first and the second electrode both consist of TiN.

In the formulae IA, IB and IC, preferred aryl groups are derived, for example, from the parent structures benzene, naphthalene, tetrahydronaphthalene, 9,10-dihydrophenanthrene, fluorene, indene and indane.

In the formulae IA, IB and IC, preferred heteroaryl groups are, for example, five-membered rings, such as, for example, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole and 1,3,4-thiadiazole, six-membered rings, such as, for example, pyridine, pyridazine, pyrimidine, pyrazine, 1,3,5-triazine, 1,2,4-triazine and 1,2,3-triazine, or condensed rings, such as, for example, indole, isoindole, indolizine, indazole, benzimidazole, benzotriazole, purine, naphthimidazole, benzoxazole, naphthoxazole, benzothiazole, benzofuran, isobenzofuran, dibenzofuran, thieno[2,3b]thiophene, thieno[3,2b]thiophene, dithienothiophene, isobenzothiophene, dibenzothiophene, benzothiadiazothiophene, 2H-chromen (2H-1-benzopyran), 4H-chromene (4H-1-benzopyran) and coumarin (2H-chromen-2-one), or combinations of these groups.

In the formulae IA, IB and IC, preferred cycloaliphatic groups are cyclobutane, cyclopentane, cyclohexane, cyclohexene, cycloheptane, decahydronaphthalene, bicyclo[1.1.1]pentane, bicyclo[2.2.2]octane, spiro[3.3]heptane and octahydro-4,7-methanoindane.

In the formulae IA, IB and IC, preferred heteroaliphatic groups are tetrahydrofuran, dioxolane, tetrahydrothiofuran, pyran, dioxane, dithiane, silinane, piperidine and pyrrolidine.

$A^1$, $A^2$ and $A^3$, independently of one another and identically or differently on each occurrence, are particularly preferably selected from the following groups:
  a) 1,4-phenylene, in which, in addition, one or two CH groups may be replaced by N and in which, in addition, one or more H atoms may be replaced by Y,
  b) the group consisting of trans-1,4-cyclohexylene and 1,4-cyclohexenylene, in which, in addition, one or more non-adjacent $CH_2$ groups may be replaced by —O— and/or —S— and in which, in addition, one or more H atoms may be replaced by Y, and
  c) the group consisting of 1,3-dioxolane-2,4-diyl, tetrahydrofuran-2,5-diyl, cyclobutane-1,3-diyl, 1,4-bicyclo[2.2.2]octanediyl, piperidine-1,5-diyl and thiophene-2,5-diyl, in which, in addition, one or more H atoms may be replaced by Y, where Y has the meaning indicated above under formula IA and preferably denotes F, Cl, CN or $CF_3$.

In the formula IA, $Sp^4$ preferably denotes a spacer group.

Preferred spacer groups Sp are selected from the formula Sp'-X'-, so that the radical G-$Sp^4$- of formula IA corresponds to the formula G-Sp'-X'—, and so that the radical G-Sp- of formula IB corresponds to the formula G-Sp'-X'-, and so that in case $R^{1C}$ of formula IC denotes $D^1$-$Z^D$— and $Z^D$ denotes a spacer group, the radical $D^1$-$Z^D$— of formula IC (likewise in formula IB) corresponds to the formula $D^1$-Sp'-X'—,
where
Sp' denotes straight-chain or branched alkylene having 1 to 20, preferably 1 to 12 C atoms, which is optionally mono- or polysubstituted by F, Cl, Br, I or CN and in which, in addition, one or more non-adjacent $CH_2$ groups may each be replaced, independently of one another, by —O—, —S—, —NH—, —$NR^0$—, —$SiR^{00}R^{000}$—, —CO—, —COO—, —OCO—, —OCO—O—, —S—CO—, —CO—S—, —$NR^0$—CO—O—, —O—CO—$NR^0$—, —$NR^0$—CO—$NR^0$—, —CH=CH— or —C≡C— in such a way that O and/or S atoms are not linked directly to one another, X' denotes —O—, —S—, —CO—, —COO—, —OCO—, —O—COO—, —CO—$NR^{00}$—, —$NR^{00}$—CO—, —$NR^{00}$—CO—$NR^{00}$—, —$OCH_2$—, —$CH_2O$—, —$SCH_2$—, —$CH_2S$—, —$CF_2O$—, —$OCF_2$—, —$CF_2S$—, —$SCF_2$—, —$CF_2CH_2$—, —$CH_2CF_2$—, —$CF_2CF_2$—, —CH=N—, —N=CH—, —N=N—, —CH=$CR^{00}$—, —$CY^x$=$CY^{x'}$—, —C≡C—, —CH=CH—COO—, —OCO—CH=CH— or a single bond, $R^0$, $R^{00}$ and $R^{000}$ each, independently of one another, denote H or alkyl having 1 to 12 C atoms, and $Y^x$ and $Y^{x'}$ each, independently of one another, denote H, F, Cl or CN.

X' is preferably —O—, —S—, —CO—, —COO—, —OCO—, —O—COO—, —CO—$NR^0$—, —$NR^0$—CO—, —$NR^0$—CO—$NR^0$— or a single bond.

Preferred groups Sp' are —$(CH_2)_{p1}$—, —$(CF_2)_{p1}$—, —$(CH_2CH_2O)_{q1}$—$CH_2CH_2$—, —$(CF_2CF_2O)_{q1}$—$CF_2CF_2$—, —$CH_2CH_2$—S—$CH_2CH_2$—, —$CH_2CH_2$—NH—$CH_2CH_2$— or —$(SiR^{00}R^{000}$—O$)_{p1}$—, in which p1 is an integer from 1 to 12, q1 is an integer from 1 to 3, and $R^{00}$ and $R^{000}$ have the meanings indicated above.

Particularly preferred groups —X'-Sp'- are —$(CH_2)_{p1}$—, —O—$(CH_2)_{p1}$—, —$(CF_2)_{p1}$—, —O$(CF_2)_{p1}$—, —OCO—$(CH_2)_{p1}$— and —OC(O)O—$(CH_2)_{p1}$—, in which p1 has the meaning indicated above.

Particularly preferred groups Sp' are, for example, in each case straight-chain ethylene, propylene, butylene, pentylene, hexylene, heptylene, octylene, nonylene, decylene, undecylene, dodecylene, octadecylene, perfluoroethylene, perfluoropropylene, perfluorobutylene, perfluoropentylene, perfluorohexylene, perfluoroheptylene, perfluorooctylene, perfluorononylene, perfluorodecylene, perfluoroundecylene, perfluorododecylene, perfluorooctadecylene, ethyleneoxyethylene, methyleneoxy-butylene, ethylenethioethylene, ethylene-N-methyliminoethylene, 1-methylalkylene, ethenylene, propenylene and butenylene.

Particularly preferred groups X' are —O— or a single bond.

Particularly preferred sub-formulae of the formula IA are the sub-formulae IAa to IAf shown below:

| | |
|---|---|
| $R^1$—$B^1$-Sp-G | IAa |
| $R^1$-($A^1$-$Z^1$)—$B^1$-Sp-G | IAb |
| $R^1$-($A^1$-$Z^1$)$_2$—$B^1$-Sp-G | IAc |
| $R^1$—$B^1$—($Z^2$-$A^2$)-Sp-G | IAd |
| $R^1$—$B^1$—($Z^2$-$A^2$)$_2$-Sp-G | IAe |
| $R^1$-($A^1$-$Z^1$)—$B^1$—($Z^2$-$A^2$-)-Sp-G | IAf | in which $R^1$, $A^1$, $A^2$, $B^1$, $Z^1$, $Z^2$, Sp and G have the meanings indicated above and preferably $A^1$ and $A^2$ denote

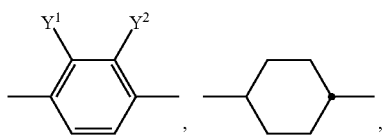

$B^1$ denotes

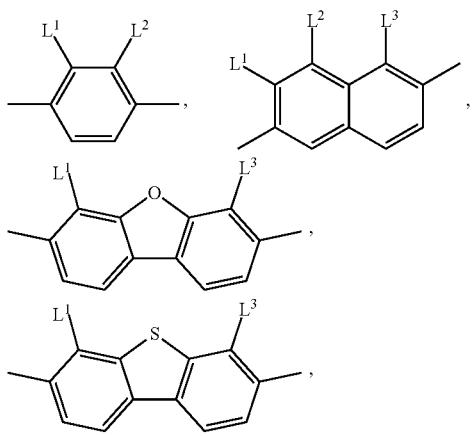

where the groups may be oriented in both directions, $R^1$ denotes alkyl having 1-15 C atoms, preferably having 1-7 C atoms, in particular $CH_3$, $C_2H_5$, n-$C_3H_7$, n-$C_4H_9$, n-$C_5H_{11}$, n-$C_6H_{13}$ or n-$C_7H_{15}$, $L^1$ and $L^2$, independently of one another, denote $CF_3$, Cl or F, where at least one of the radicals $L^1$ and $L^2$ denotes F, $L^3$ denotes F, $Y^1$ and $Y^2$, independently of one another, denote $CF_3$, Cl or F, $Z^1$, $Z^2$, independently of one another, denote a single bond, —$CF_2O$—, —$OCF_2$—, —$CH_2O$—, $OCH_2$— or —$CH_2CH_2$—, Sp denotes unbranched 1,ω-alkylene having 1 to 12 C atoms, G denotes —OH, —SH, —$SO_2OH$, —$OP(O)(OH)_2$, —PO$(OH)_2$, —$COH(PO(OH)_2)_2$, —COOH, —Si$(OR^x)_3$ or —$SiCl_3$ in which $R^x$ denotes methyl or ethyl.

In a further preferred embodiment, in the compounds of the formulae IAa to IAf,

Sp denotes unbranched 1,ω-perfluoroalkylene having 1 to 12 C atoms, where $R^1$, $A^1$, $A^2$, $B^1$, $Z^1$, $Z^2$ and G have the meanings indicated above.

Very particularly preferred sub-formulae of the formula IA are the sub-formulae IAa, IAb and IAd.

Examples of preferred compounds of the formulae IAa to IN are shown below:

IAa-1

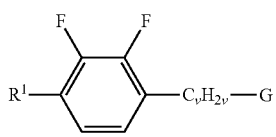

IAa-2

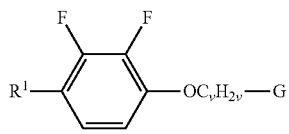

IAa-3

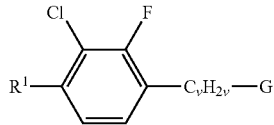

IAa-4

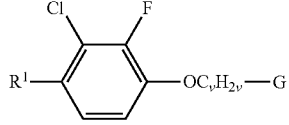

IAa-5

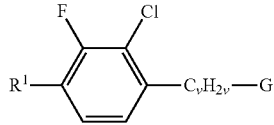

IAa-6

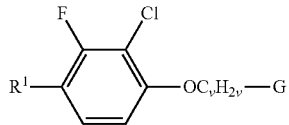

IAa-7

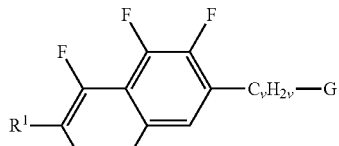

IAa-8

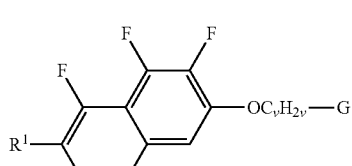

IAa-9

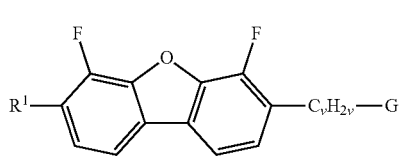

IAa-10

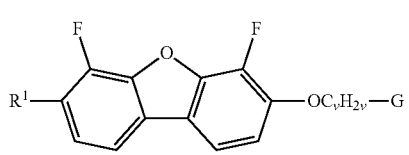

IAa-11

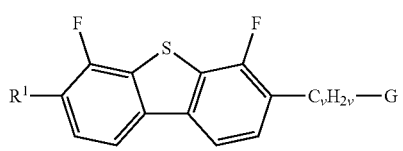

IAa-12
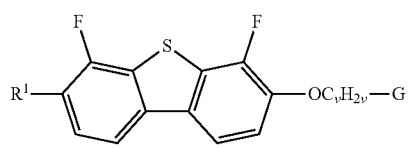
IAb-1
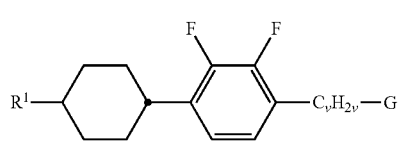
IAb-2
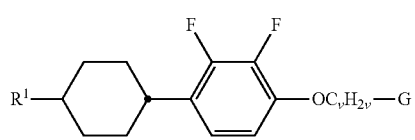
IAb-3
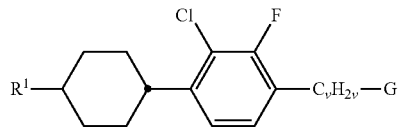
IAb-4
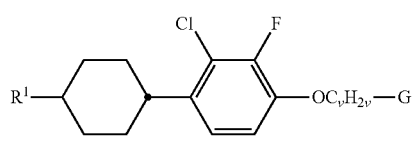
IAb-5
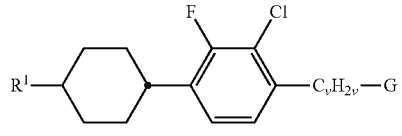
IAb-6
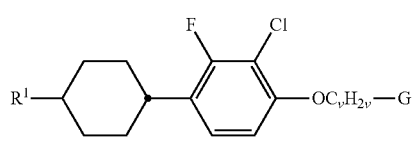
IAb-7
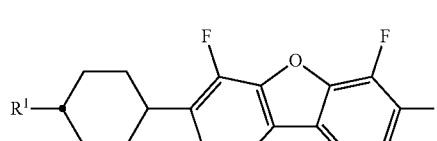
IAb-8
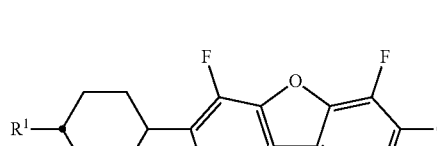
IAb-9
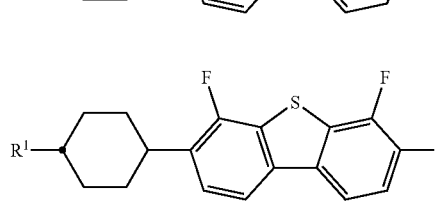
IAb-10
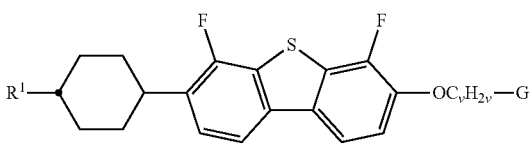
IAb-11
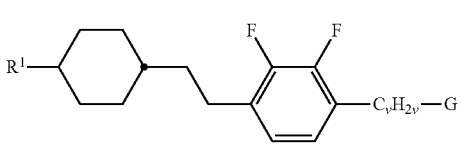
IAb-12
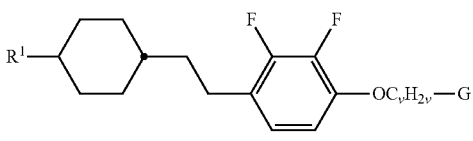
IAb-13
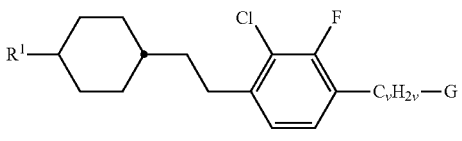
IAb-14
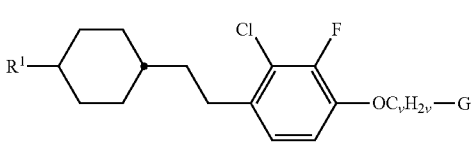
IAb-15
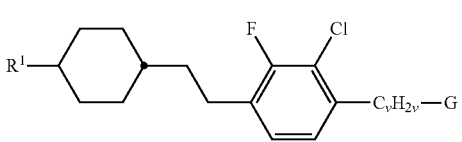
IAb-16
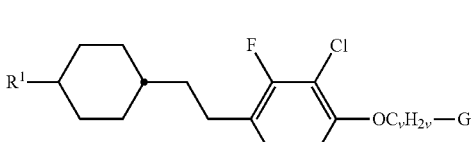
IAb-17
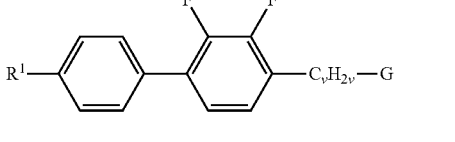
IAb-18
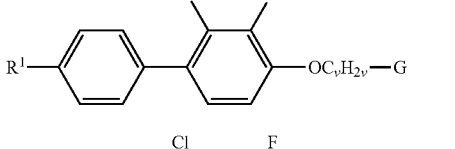
IAb-19
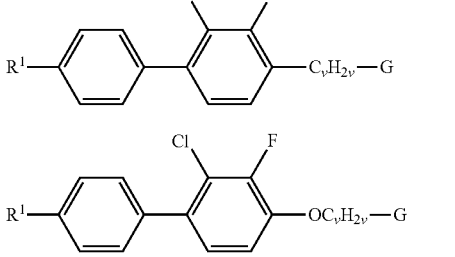
IAb-20

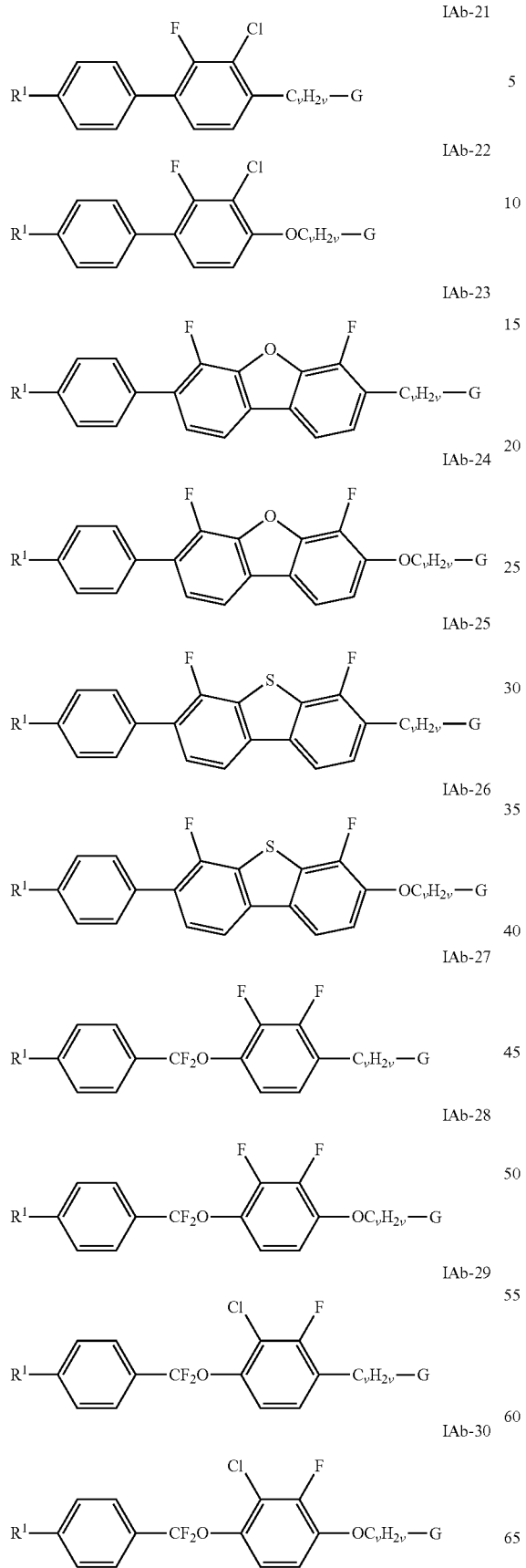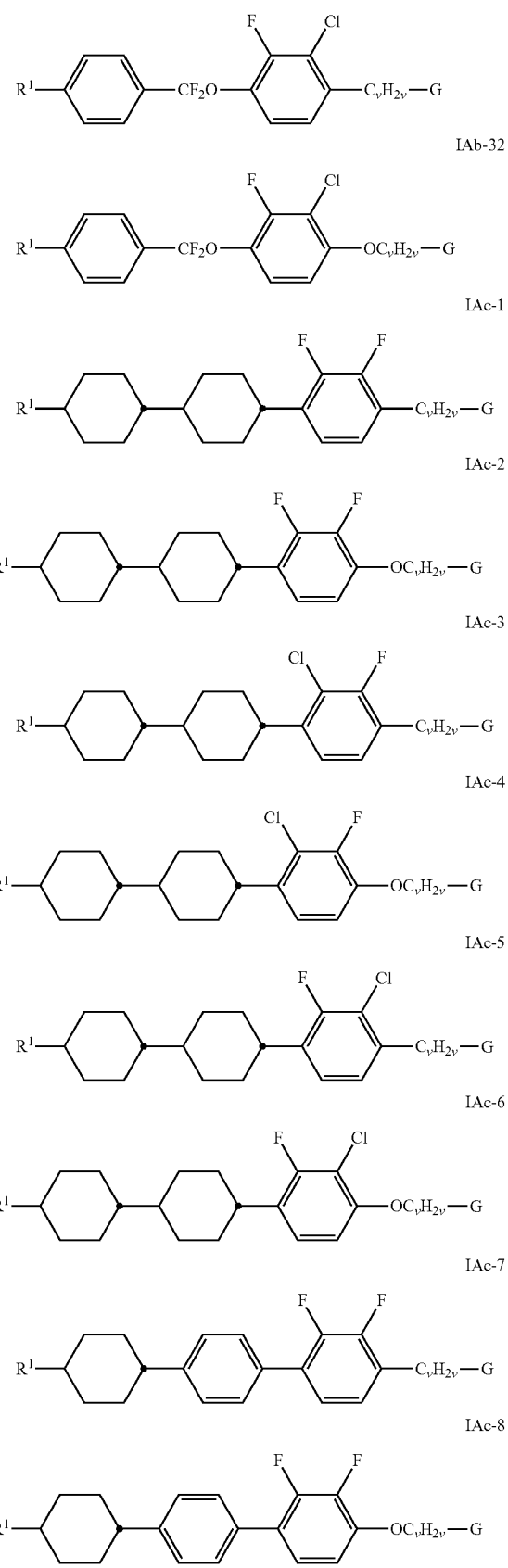

IAc-9
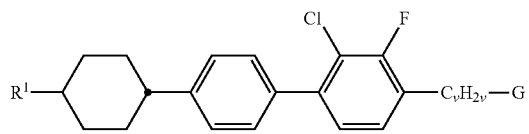
IAc-10
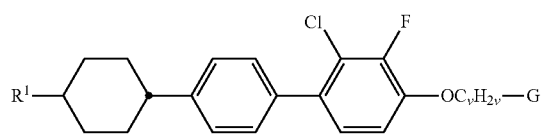
IAc-11
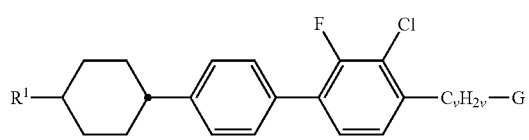
IAc-12
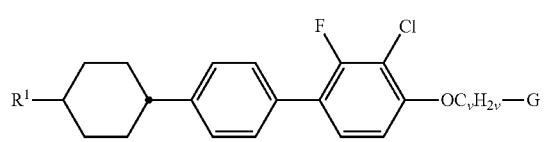
IAc-13
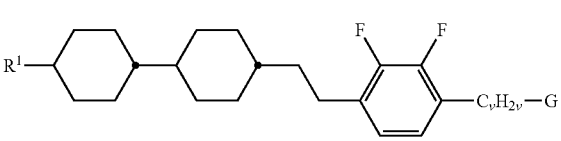
IAc-14
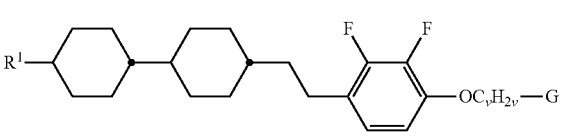
IAc-15
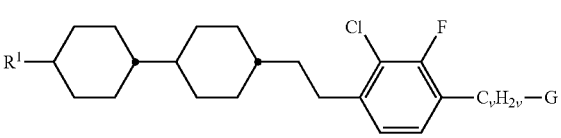
IAc-16
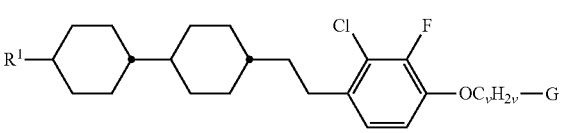
IAc-17
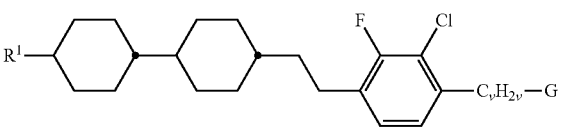
IAc-18
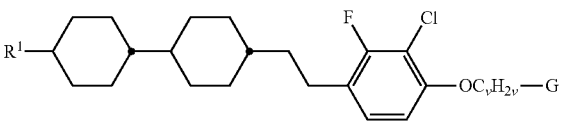
IAc-19
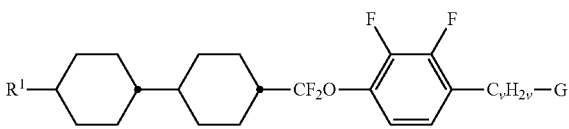
IAc-20
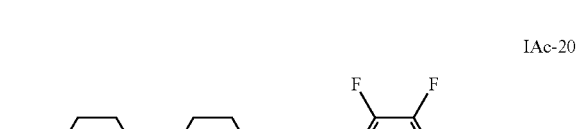
IAc-21
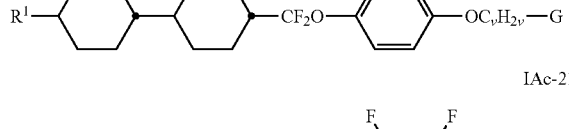
IAc-22
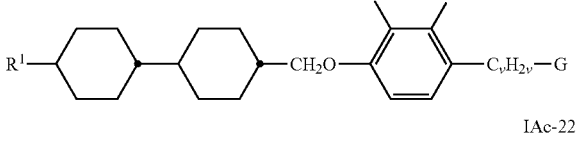
IAc-23
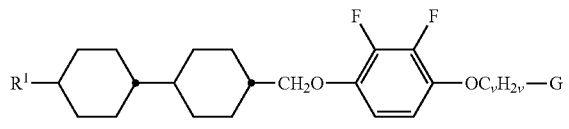
IAc-24
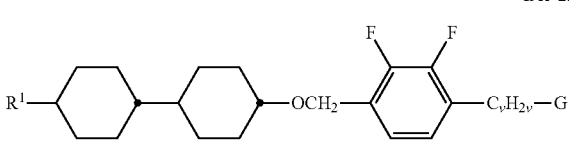
IAc-25
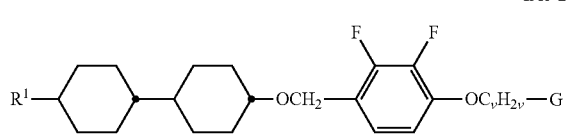
IAc-26
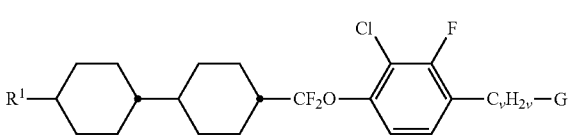
IAc-27
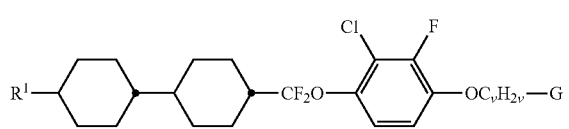
IAc-28
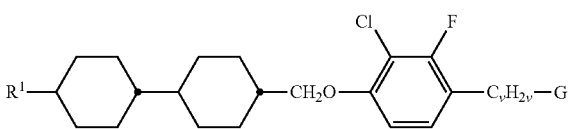
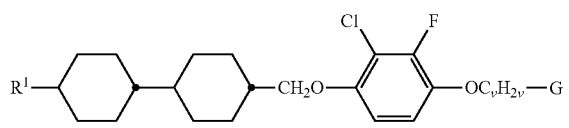

IAc-29
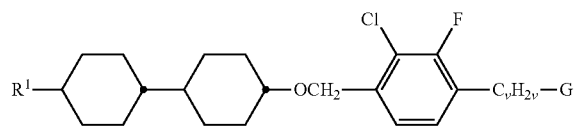
IAc-30
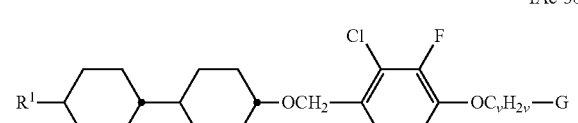
IAc-31
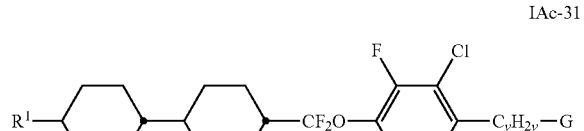
IAc-32
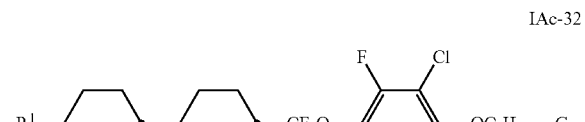
IAc-33
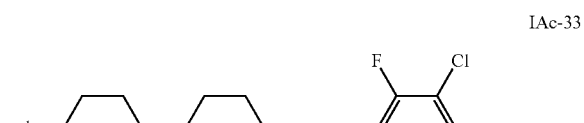
IAc-34
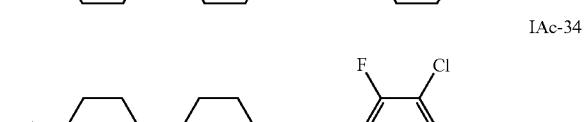
IAc-35
IAc-36
IAc-37
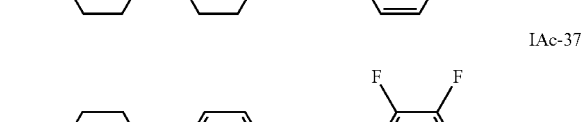
IAc-38
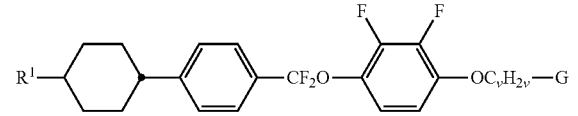
IAc-39
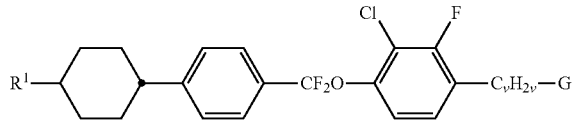
IAc-40
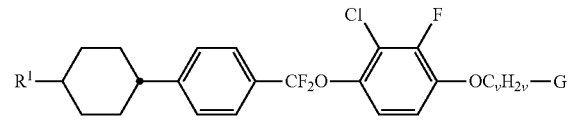
IAc-41
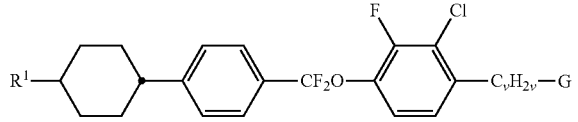
IAc-42
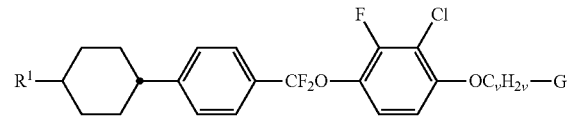
IAd-1
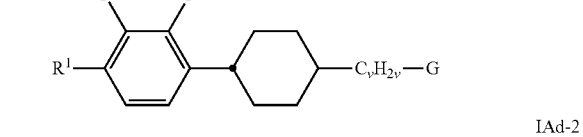
IAd-2
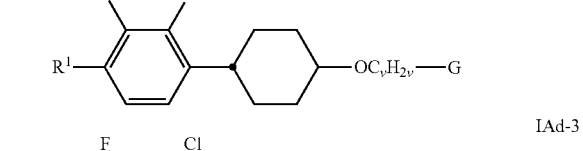
IAd-3
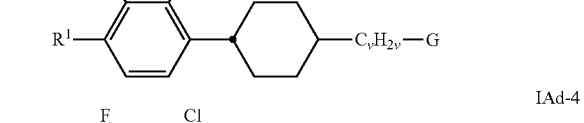
IAd-4
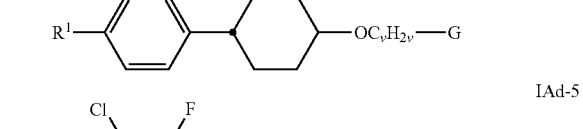
IAd-5
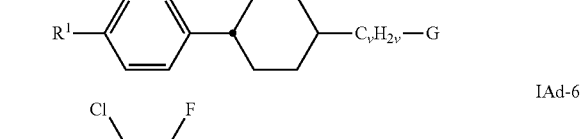
IAd-6
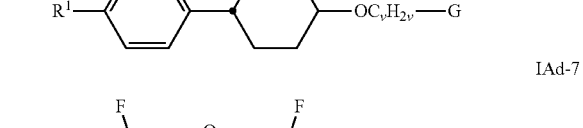
IAd-7
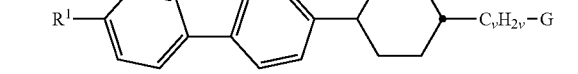

IAd-8
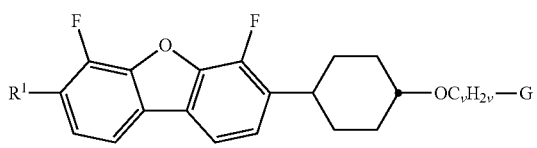
IAd-9
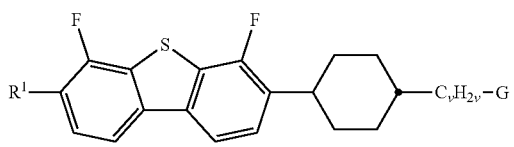
IAd-10
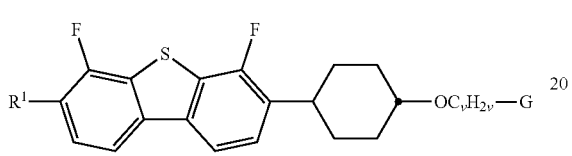
IAd-11
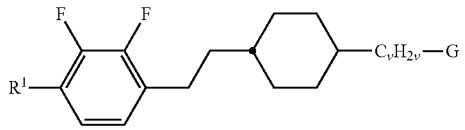
IAd-12
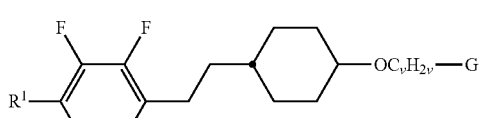
IAd-13
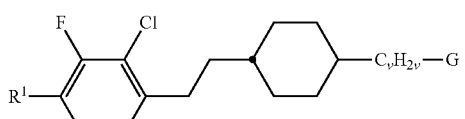
IAd-14
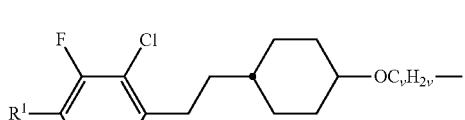
IAd-15
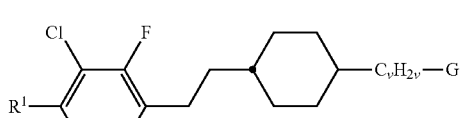
IAd-16
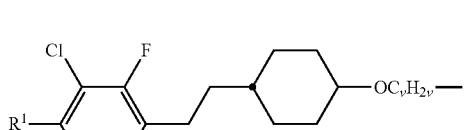
IAd-17
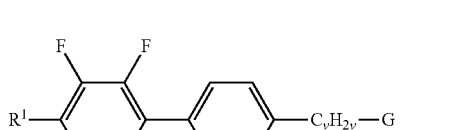
IAd-18
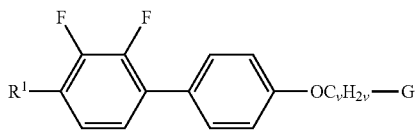
IAd-19
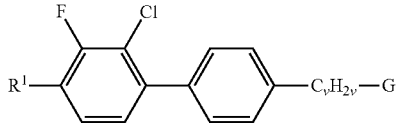
IAd-20
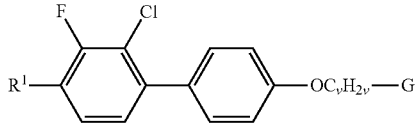
IAd-21
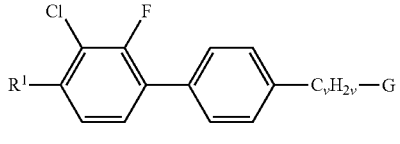
IAd-22
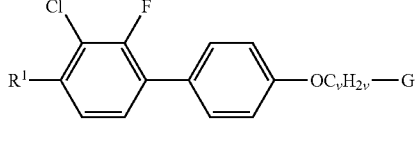
IAd-23
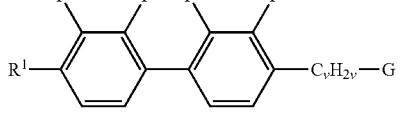
IAd-24
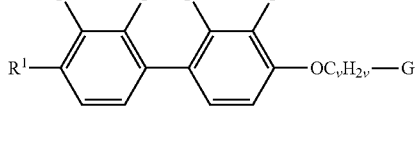
IAd-25
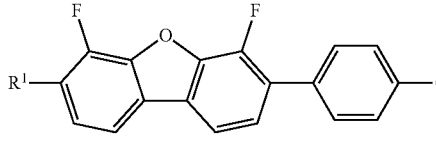
IAd-26
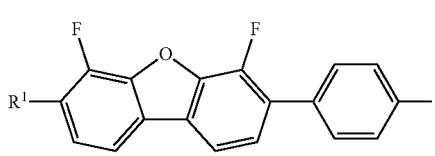
IAd-27
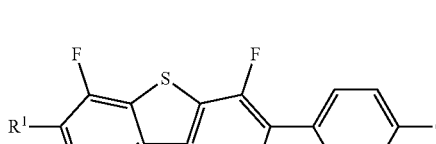

IAd-28
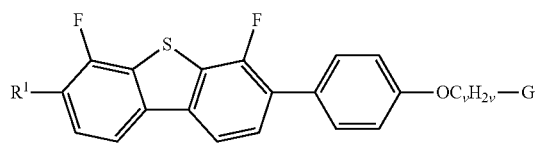
IAd-29
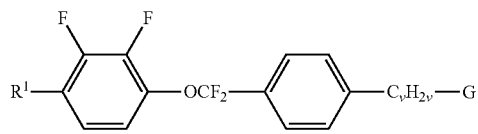
IAd-30
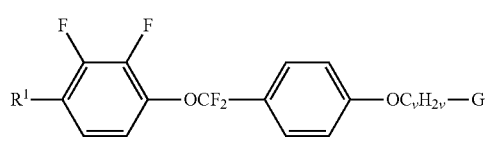
IAd-31
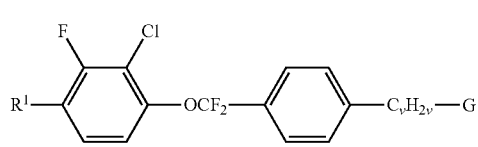
IAd-32
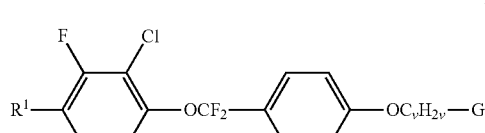
IAd-33
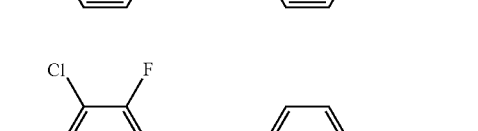
IAd-34
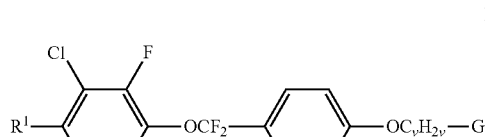
IAe-1
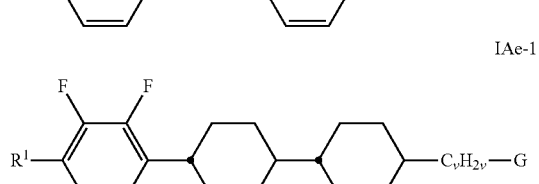
IAe-2
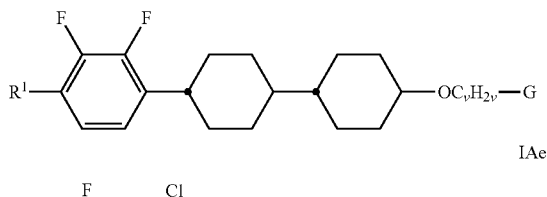
IAe-4
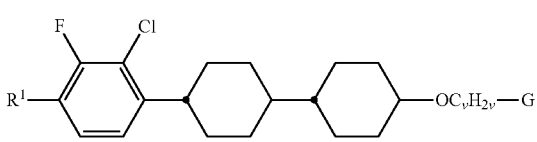
IAe-5
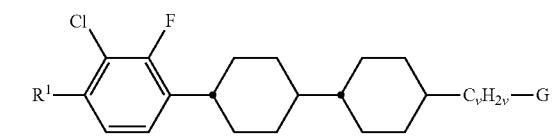
IAe-6
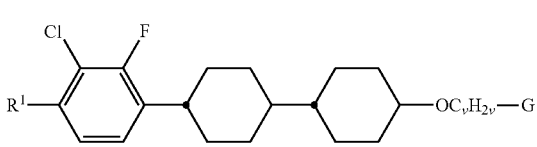
IAe-7
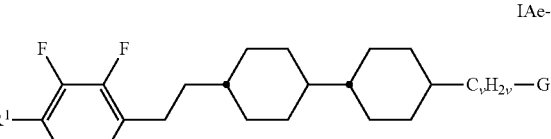
IAe-8
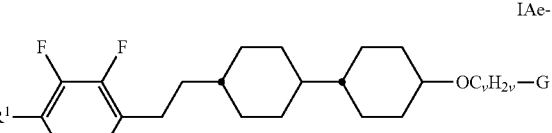
IAe-9
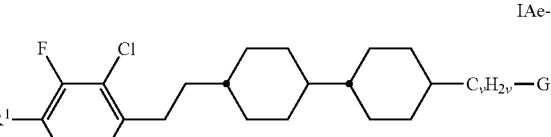
IAe-10
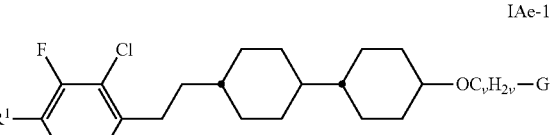
IAe-11
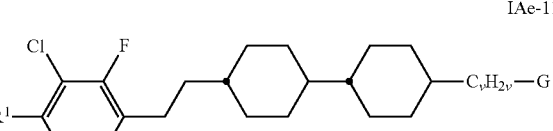
IAe-12
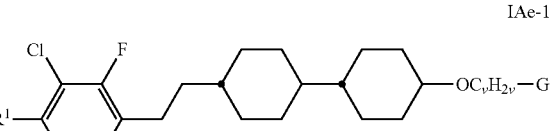
IAe-13
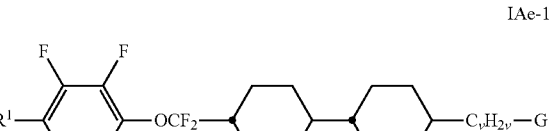

IAe-14
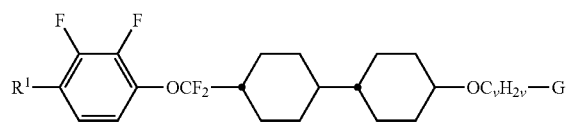
IAe-15
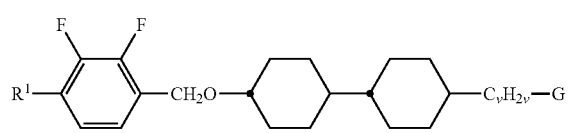
IAe-16
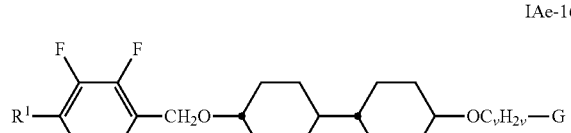
IAe-17
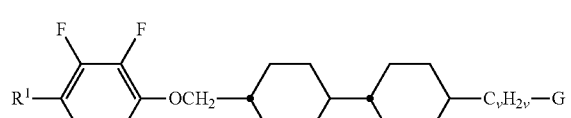
IAe-18
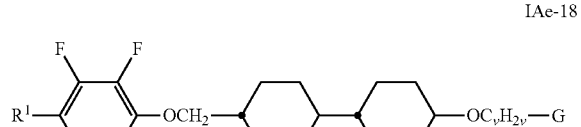
IAe-19
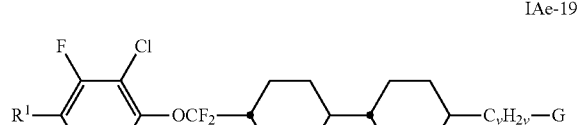
IAe-20
IAe-21
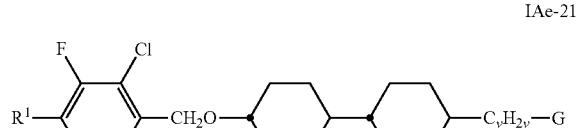
IAe-22
IAe-23
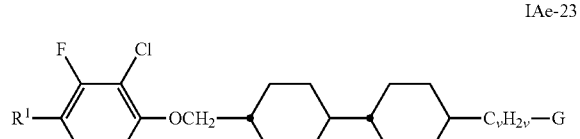
IAe-24
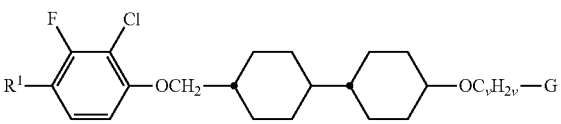
IAe-25
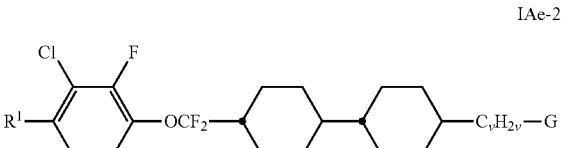
IAe-26
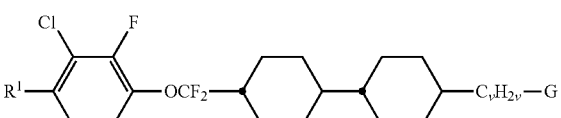
IAe-27
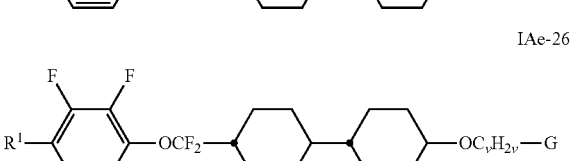
IAe-28
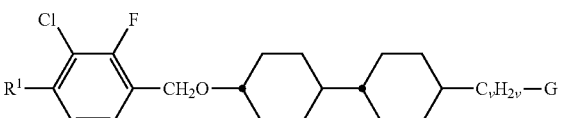
IAe-29
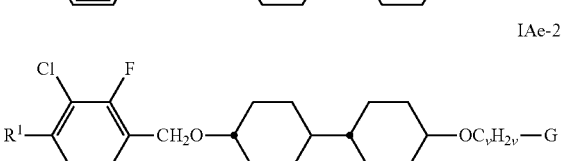
IAe-30
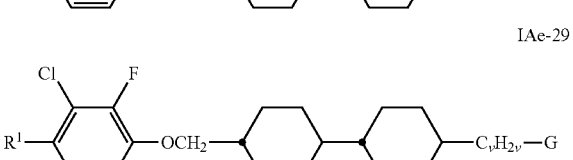
IAe-31
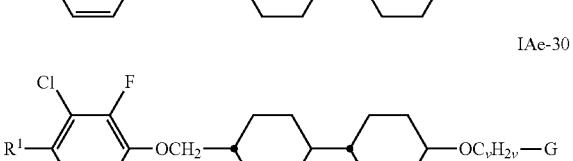
IAe-32
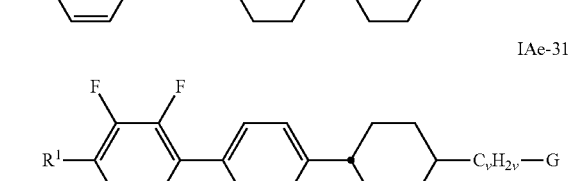
IAe-33
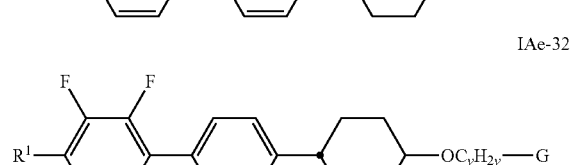

IAe-34
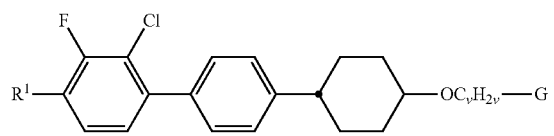
IAe-35
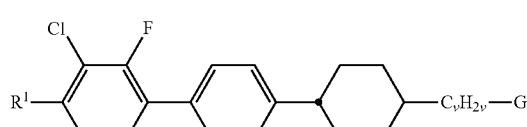
IAe-36
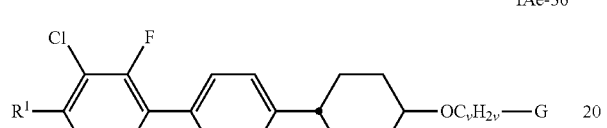
IAe-37
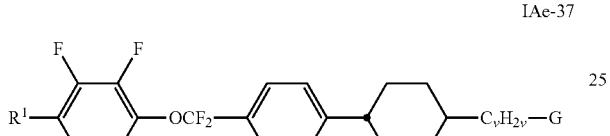
IAe-38
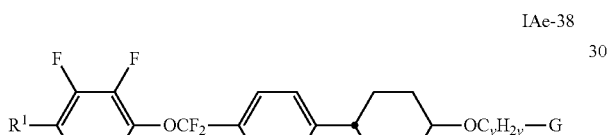
IAe-39
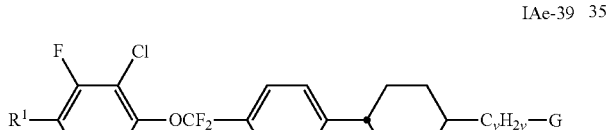
IAe-40
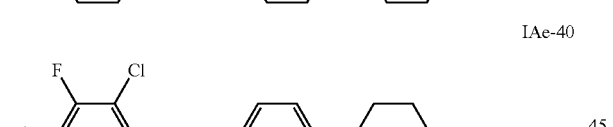
IAe-41
IAe-42
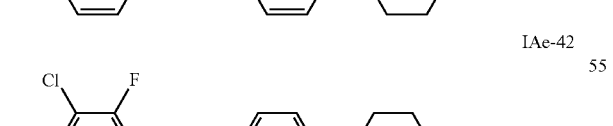
IAf-1
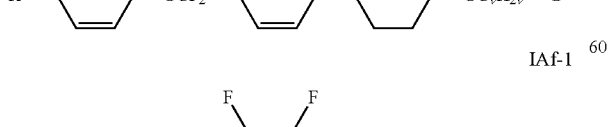
IAf-2
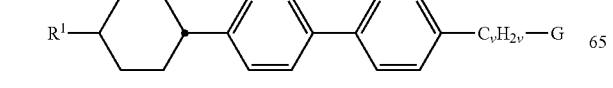
IAf-2
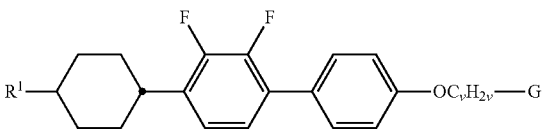
IAf-3
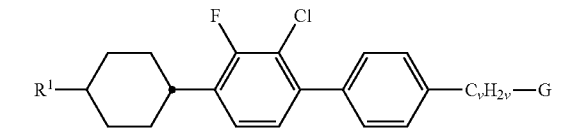
IAf-4
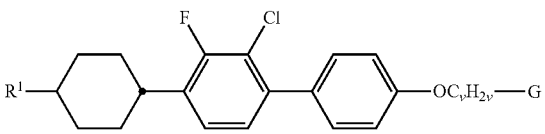
IAf-5
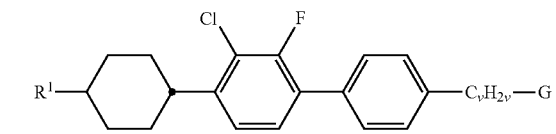
IAf-6
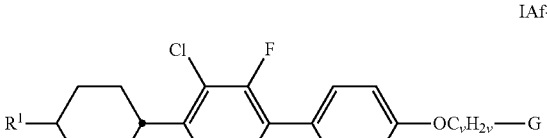
IAf-7
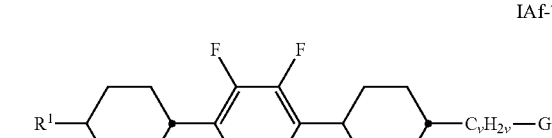
IAf-8
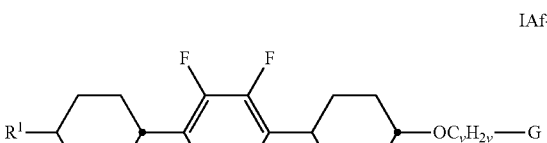
IAf-9
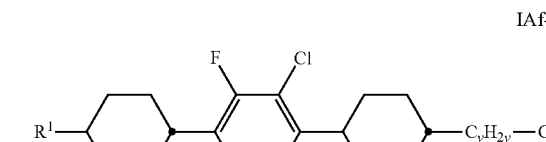
IAf-10
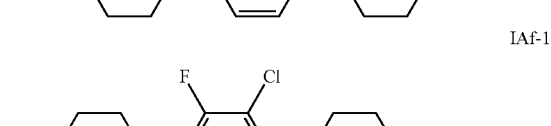
IAf-11
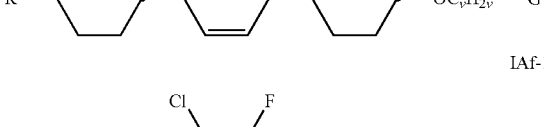

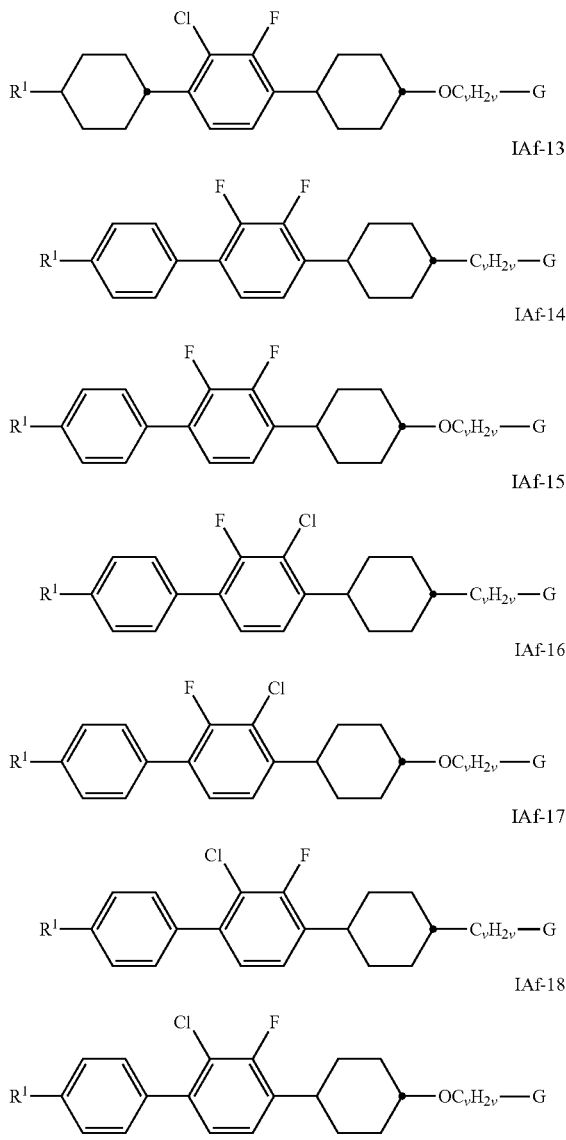

$D^1-Z^D-B^1-(Z^2-A^2)_2-Sp-G$     IBe $D^1-Z^D-(A^1-Z^1)-B^1-(Z^2-A^2)-Sp-G$     IBf in which $D^1$, $A^1$, $A^2$, $B^1$, $Z^D$, $Z^1$, $Z^2$, Sp and G have the meanings indicated above.

In formula IB and its sub-formulae, very preferably $A^1$ and $A^2$ identically or differently, denote

[structures with $Y^1$, $Y^2$ substituted benzene ring, or cyclohexane ring] or $B^1$ denotes

[structures with $L_1$, $L_2$ substituted benzene; $L_1$, $L_2$, $L_3$ substituted naphthalene; dibenzofuran; or dibenzothiophene]

$D^1$ denotes adamantyl or diamantyl, in particular adamantyl, $L^1$ and $L^2$, independently of one another, denote $CF_3$, Cl or F, where at least one of the radicals $L^1$ and $L^2$ denotes F, $L^3$ denotes F, $Y^1$ and $Y^2$, independently of one another, denote $CF_3$, Cl or F, $Z^D$ denotes a single bond, —C≡C—, —C(O)O—, —OC(O)—, —OCH$_2$—, —CH$_2$O—, —CH$_2$CH$_2$—, —CH$_2$CH$_2$CH$_2$—, or —CH$_2$CH$_2$CH$_2$CH$_2$—, $Z^1$, $Z^2$, independently of one another, denote a single bond, —C(O)O—, —OC(O)—, —CF$_2$O—, —OCF$_2$—, —CH$_2$O—, —OCH$_2$—, —CH$_2$CH$_2$—, particularly preferably a single bond, Sp denotes unbranched 1,ω-alkylene having 1, 2, 3, 4, 5, 6, 7, 8, 9, 10, 11 or 12 C atoms, G denotes —OP(O)(OH)$_2$, —PO(OH)$_2$, —COH(PO(OH)$_2$)$_2$.

In a further preferred embodiment, in the compounds of the formulae IBa to IBf,

Sp denotes unbranched 1,ω-perfluoroalkylene having 1 to 12 C atoms, where $D^1$, $A^1$, $A^2$, $B^1$, $Z^1$, $Z^2$, and G have the meanings indicated above.

Very particularly preferred sub-formulae of the formula IB are the sub-formulae IBa, IBb and IBd, in particular the following compounds:

in which $R^1$ has the meaning of $R^{1A}$ defined above and G has the meanings given above and preferably $R^1$ denotes alkyl having 1 to 7 C atoms, G denotes —P(O)(OH)$_2$ or —COH(P(O)(OH)$_2$)$_2$, and v denotes an integer from 1 to 12, preferably from 2 to 7.

Also covered by the description are compounds of the formula IA in which the group —C$_v$H$_{2v}$— has been replaced by —C$_v$F$_{2v}$— in the sub-formulae IAa-1 to IAa-12, IAb-1 to IAb-32, IAc-1 to IAc-42, IAd-1 to IAd-34, IAe-1 to IAe-42 and IAf-1 to IAf-18.

Particularly preferred sub-formulae of the formula IB are the sub-formulae IBa to IBf:

$D^1-Z^D-B^1-Sp-G$     IBa $D^1-Z^D-(A^1-Z^1)-B^1-Sp-G$     IBb $D^1-Z^D-(A^1-Z^1)_2-B^1-Sp-G$     IBc $D^1-Z^D-B^1-(Z^2-A^2)-Sp-G$     IBd

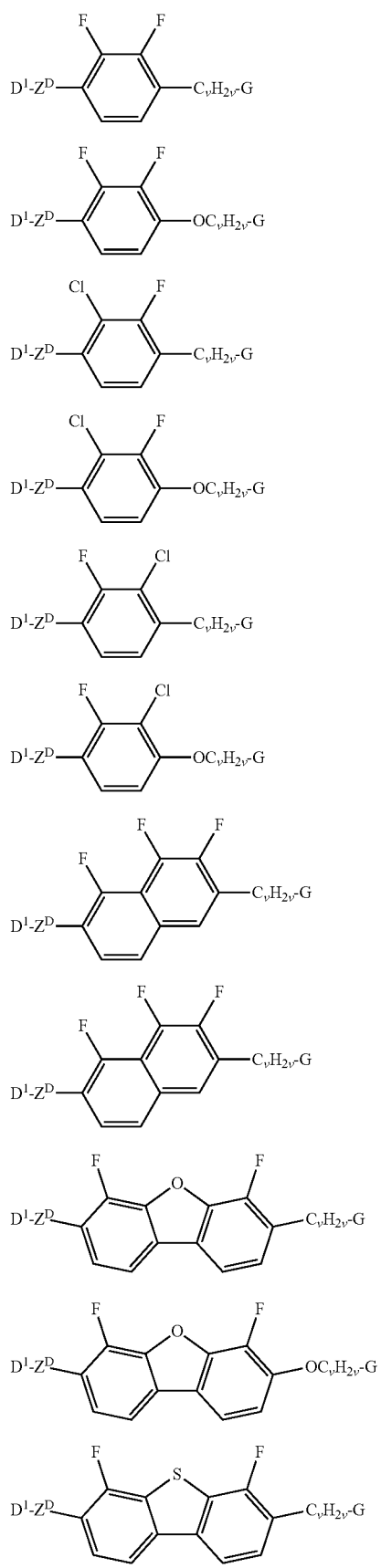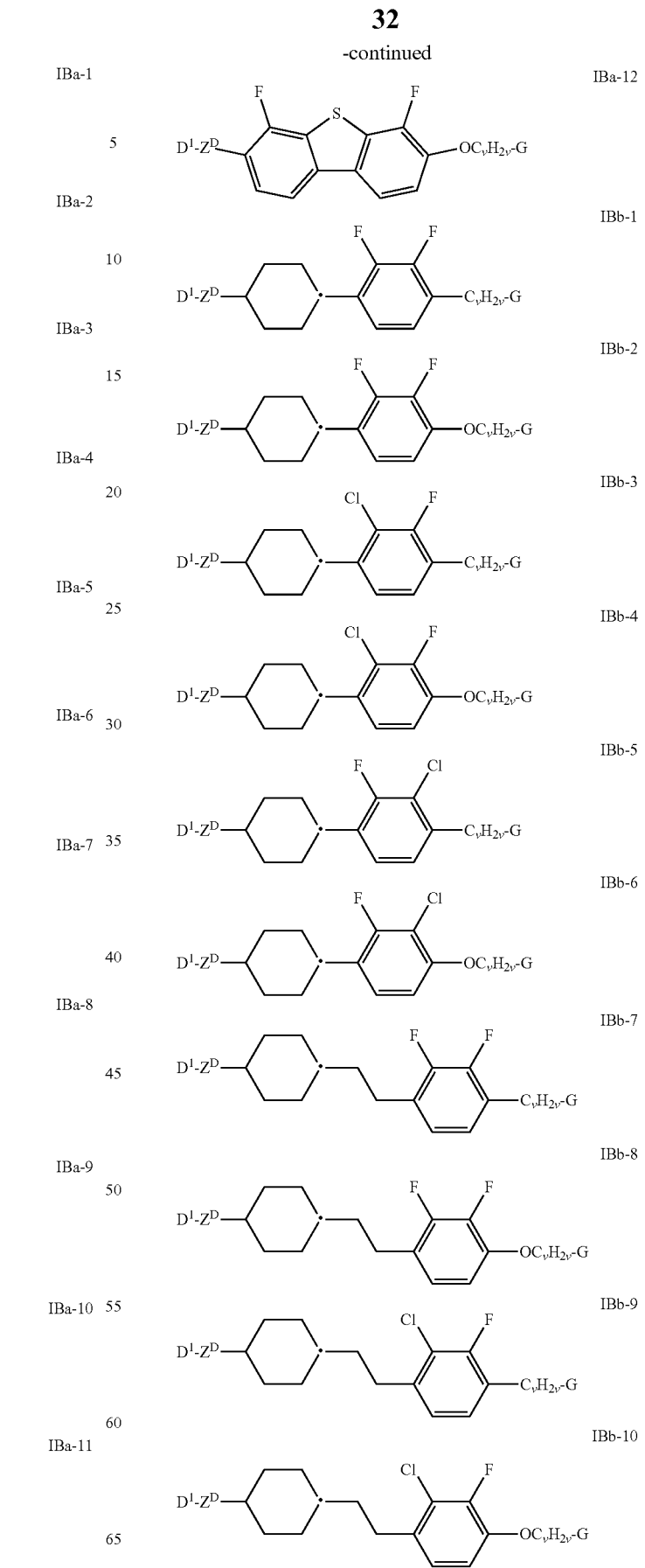

IBb-11
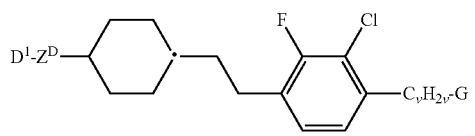
IBb-12
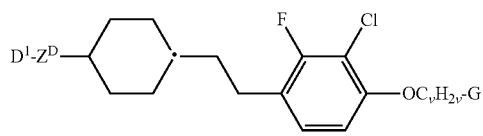
IBb-13
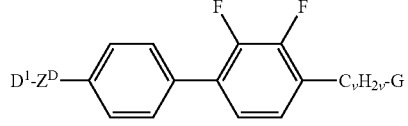
IBb-14
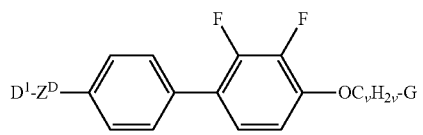
IBb-15
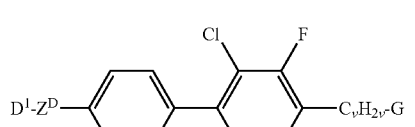
IBb-16
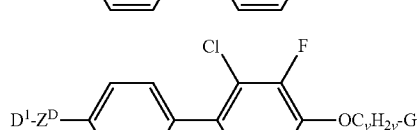
IBb-17
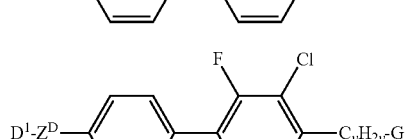
IBb-18
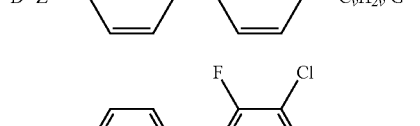
IBb-19
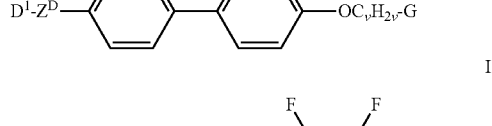
IBb-20
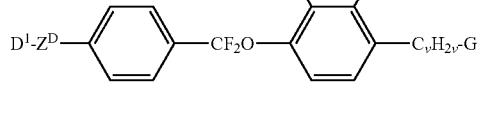
IBb-21
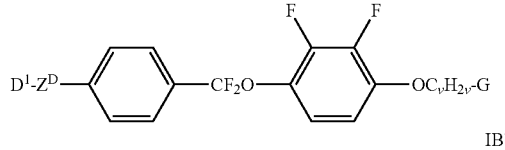
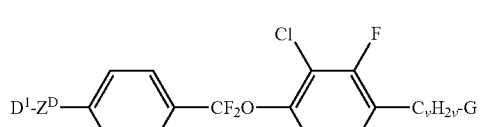
IBb-22
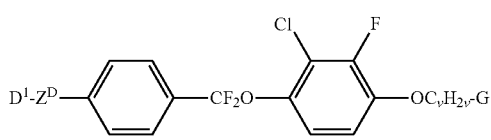
IBb-23
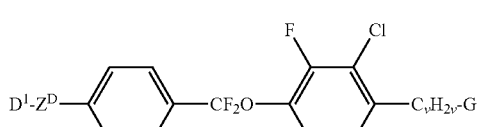
IBb-24
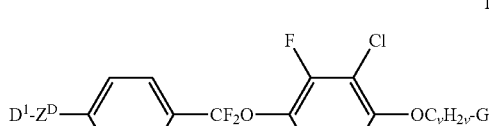
IBd-1
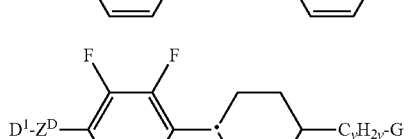
IBd-2
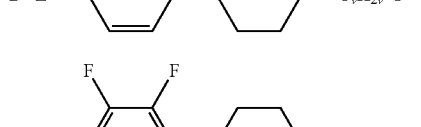
IBd-3
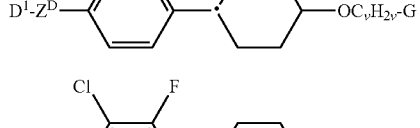
IBd-4
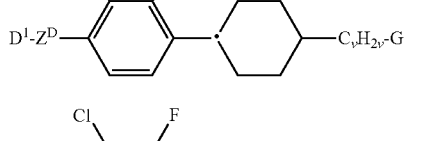
IBd-5
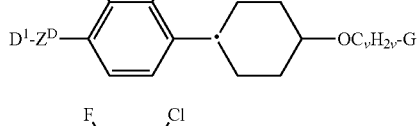
IBd-6
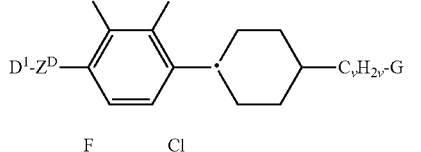
IBd-7
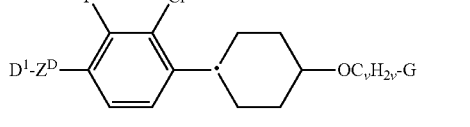
IBd-8

-continued

IBd-9
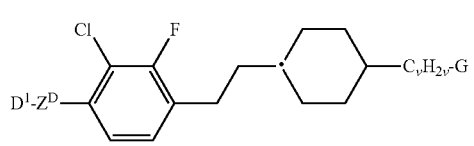

IBd-10
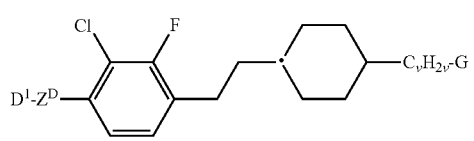

IBd-11
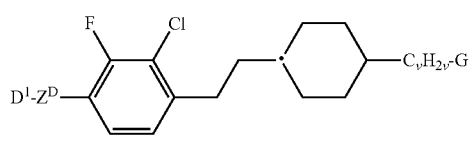

IBd-12
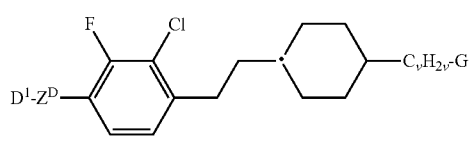

IBd-13
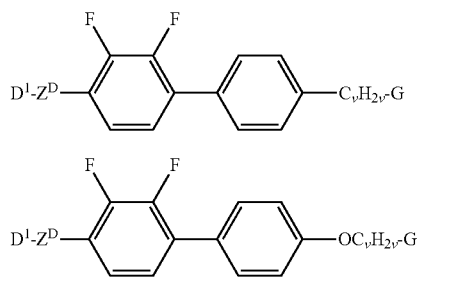

IBd-14

IBd-15
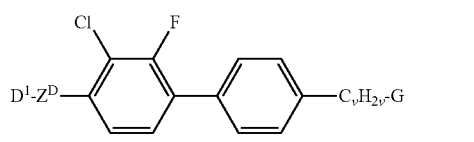

IBd-16
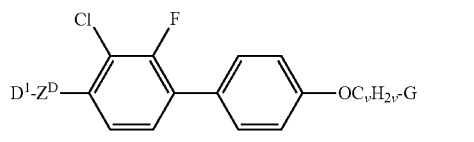

IBd-17
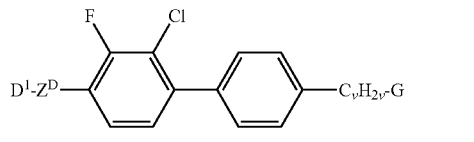

IBd-18
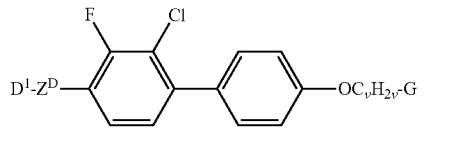

in which $D^1$, $Z^D$, and G have the meanings given above and preferably
$D^1$ denotes adamantyl or diamantyl,
$Z^D$ denotes —CH$_2$O—, —C≡C— or a single bond,
G denotes —P(O)(OH)$_2$ or —COH(P(O)(OH)$_2$)$_2$,
and in which
v is an integer from 1 to 12, preferably from 2 to 7.

Also covered by the description are compounds of the formula IB in which the group —C$_v$H$_{2v}$— has been replaced by —C$_v$F$_{2v}$— in the sub-formulae IBa-1 to IBa-12, IBb-1 to IBb-24, and IBd-1 to IBd-18.

In formula IC and its sub-formulae, very preferably $A^1$ and $A^3$ identically or differently, denote

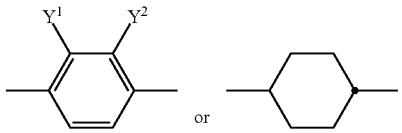

or $A^{2C}$-$Z^L$ denotes

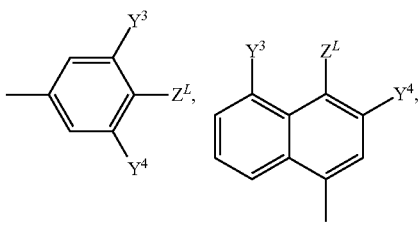

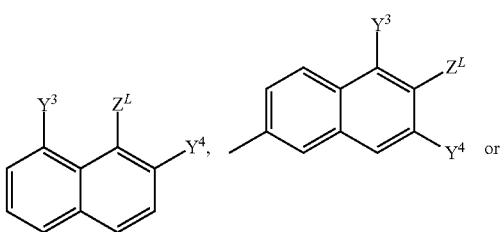

or

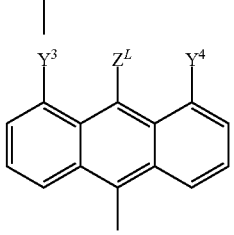

$B^1$ denotes

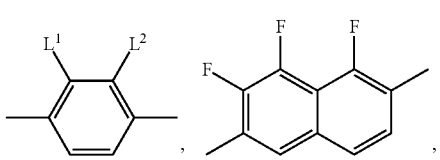

,

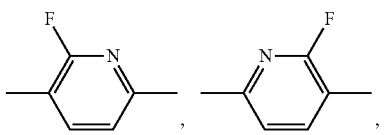

,

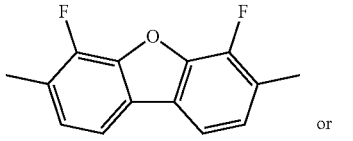

or

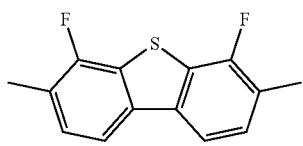

$R^{1C}$ denotes H, straight chain or branched alkyl, alkenyl, alkynyl, alkoxy each having up to 12 C atoms, adamantyl or adamantylmethyloxy, $L^1$ and $L^2$ identically or differently, denote F, $CF_3$ or Cl, $Y^1$ and $Y^2$ identically or differently, have one of the meanings given above for Y and preferably denote $CF_3$, F or Cl, $Y^3$ and $Y^4$, identically or differently, have one of the meanings given above for $Y^3$ and $Y^4$ and preferably denote methyl, ethyl, isopropyl, cyclopropyl, cyclobutyl, cyclopentyl, cyclopentenyl, cyclohexyl, cyclohexenyl, methoxy, trifluoromethyl, trifluoromethoxy, or trifluoromethylthio $Z^L$ denotes —O—, $Z^1$, $Z^2$, independently of one another, denote a single bond, —C(O)O—, —OC(O)—, —$CF_2O$—, —$OCF_2$—, —$CH_2O$—, $OCH_2$— or —$CH_2CH_2$—, in particular a single bond, and G denotes —OP(O)(OH)$_2$, —PO(OH)$_2$, or —COH(PO(OH)$_2$)$_2$.

Very preferred sub-formulae of the formula IC are the sub-formulae IC-1 to IC-6:

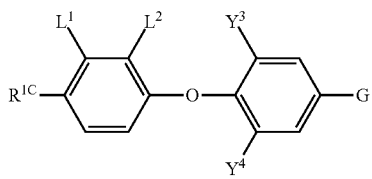

IC-1

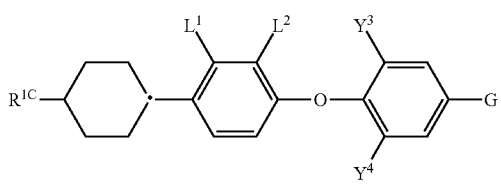

IC-2

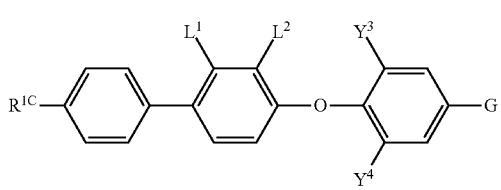

IC-3

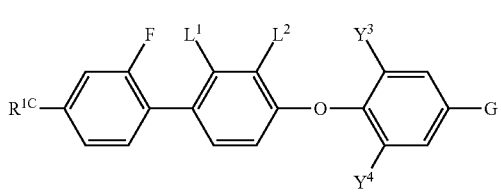

IC-4

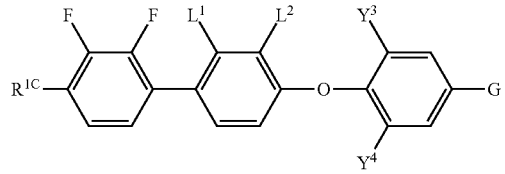

IC-5

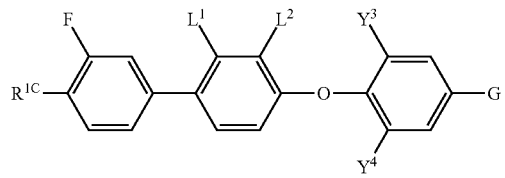

IC-6 in which $R^{1C}$ has one of the meanings given above, $L^1$ and $L^2$ identically or differently, denote F, $CF_3$, or Cl, $Y^3$ and $Y^4$, identically or differently, have one of the meanings given above and preferably denote methyl, and G denotes —PO(OH)$_2$, or —COH(PO(OH)$_2$)$_2$.

According to another aspect of the invention the molecular layer comprises one or more chiral non-racemic compounds selected from the compounds of the formulae IA, IB and IC.

The molecular layers obtained from chiral compounds of the formulae IA, IB and IC enable memristic devices with significantly reduced stochastic noise and faster switching, reducing the read and write error rate, which has a positive effect on energy-efficiency. In addition, increased tunnel current are observed allowing for the integration to smaller junction sizes.

Preferably, the chiral compound has an enantiomeric excess (ee) of above 50%, preferably above 80%, 90%, or 95%, more preferably above 97%, in particular above 98%.

Chirality is achieved by a branched chiral group Sp of formula IA, IB or IC above having one or more, preferably one or two, very preferably one, asymmetrically substituted carbon atom (or: asymmetric carbon atom, C*), hereinafter referred to as Sp*.

In Sp* the asymmetric carbon atom is preferably linked to two differently substituted carbon atoms, a hydrogen atom and a substituent selected from the group halogen (preferably F, Cl, or Br), alkyl or alkoxy with 1 to 5 carbon atoms in each case, and CN.

The chiral organic radical Sp* preferably has the formula

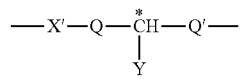

in which

X' has the meanings defined above and preferably denotes —CO—O—, —O—CO—, —O—CO—O—, —CO—, —O—, —S—, —CH=CH—, —CH=CH—COO— or a single bond, more preferably —CO—O—, —O—CO—, —O— or a single bond, very preferably —O— or a single bond, Q and Q' identically or differently, denote a single bond or optionally fluorinated alkylene having 1 to 10 carbon atoms, in which a $CH_2$ group not linked with X can also be replaced by —O—, —CO—, —O—CO—, —CO—

O— or —CH=CH—, preferably alkylene having 1 to 10 carbon atoms or a single bond, particularly preferably —(CH$_2$)$_{n5}$— or a single bond, n5 is 1, 2, 3, 4, 5, or 6, Y denotes optionally fluorinated alkyl having 1 to 15 carbon atoms, in which one or two non-adjacent CH$_2$ groups can also be replaced by —O—, —CO—, —O—CO—, —CO—O— and/or —CH=CH—, further CN or halogen, preferably optionally fluorinated alkyl or alkoxy having 1 to 7 C atoms, —CN or Cl, particularly preferably —CH$_3$, —C$_2$H$_5$, —CF$_3$ or Cl, In an embodiment in which $Z^D$ in formula IB is a chiral non-racemic spacer group, the group D$^1$-Sp* preferably has the formula

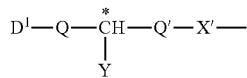

in which the occurring groups have the meanings given above.

In addition, chirality is achieved by a chiral group $R^{1A}$ of formula IA above or by a chiral group $R^{1C}$ of formula IC above having one or more, preferably one or two, very preferably one, asymmetrically substituted carbon atom (or: asymmetric carbon atom, C*), hereinafter referred to as R*.

In R* the asymmetric carbon atom is preferably linked to two differently substituted carbon atoms, a hydrogen atom and a substituent selected from the group halogen (preferably F, Cl, or Br), alkyl or alkoxy with 1 to 5 carbon atoms in each case, and CN.

The chiral organic radical preferably has the formula

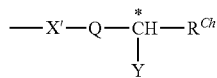

in which

X' has the meanings defined above for formula I and preferably denotes —CO—O—, —O—CO—, —O—CO—O—, —CO—, —O—, —S—, —CH=CH—, —CH=CH—COO— or a single bond, more preferably —CO—O—, —O—CO—, —O—, or a single bond, very preferably —O— or a single bond, Q denotes a single bond or optionally fluorinated alkylene having 1 to 10 carbon atoms, in which a CH$_2$ group not linked with X can also be replaced by —O—, —CO—, —O—CO—, —CO—O— or —CH=CH—, preferably alkylene having 1 to 5 carbon atoms or a single bond, particularly preferably —CH$_2$—, —CH$_2$CH$_2$— or a single bond, Y denotes optionally fluorinated alkyl having 1 to 15 carbon atoms, in which one or two non-adjacent CH$_2$ groups can also be replaced by —O—, —CO—, —O—CO—, —CO—O— and/or —CH=CH—, further CN or halogen, preferably optionally fluorinated alkyl or alkoxy having 1 to 7 C atoms, —CN or Cl, particularly preferably —CH$_3$, —C$_2$H$_5$, —CF$_3$ or Cl, $R^{Ch}$ denotes an alkyl group having 1 to 15 carbon atoms that is different from Y, in which one or two non-adjacent CH$_2$ groups can also be replaced by —O—, —CO—, —O—CO—, —CO—O— and/or —CH=CH—, preferably denotes straight-chain alkyl having 1 to 10, in particular 1 to 7, carbon atoms, in which the CH$_2$ group linked to the asymmetric carbon atom can be replaced by —O—, —O—CO— or —CO—O—.

In an embodiment in which $R^{1C}$ of formula IC denotes a group D$^1$-Z$^D$ as defined above, the group R* has the formula D$^1$-Sp* in which Sp* denotes a chiral non-racemic spacer group.

As described for formula IB, the group D$^1$-Sp* in formula IC preferably has the formula

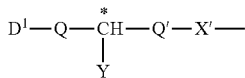

in which Dia, Q, Y and X' have the meanings defined above, and

Q' identically or differently, has the meanings given above for Q.

SYNTHESIS EXAMPLES

Example 1

The synthesis of phosphonic acid PA1 is described in WO 2018/007337 A2

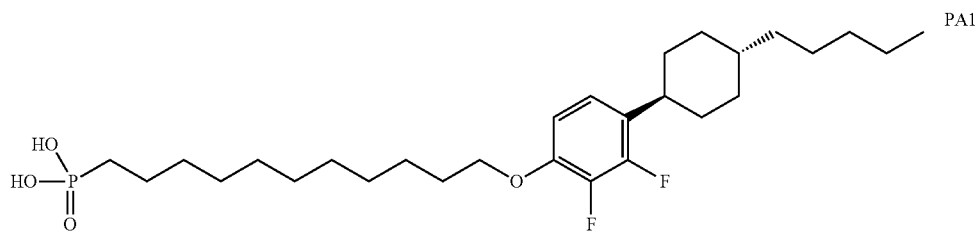 [SMILES: CCCCC[C@H]1CC[C@H](c2ccc(OCCCCCCCCCCCP(=O)(O)O)c(F)c2F)CC1]

Example 2

Step 1: (2S)-3-[2,3-difluoro-4-(4-pentylcyclohexyl)phenoxy]-2-methyl-propan-1-ol

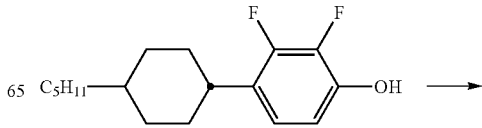

-continued

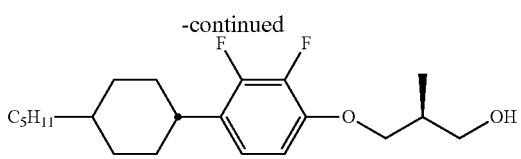

2,3-difluoro-4-(4-pentylcyclohexyl)phenol (11.07 g, 39.21 mmol) is dissolved in butanone (144 mL), (R)-3-bromo-2-methylpropan-1-ol (9.00 g, 58.81 mmol) is added, followed by potassium carbonate (21.68 g, 156.8 mmol, 4.0 eq) in one portion and the mixture is heated under reflux overnight. The reaction is filtered, concentrated to dryness and the crude product is recrystallized from acetonitrile to give (2S)-3-[2,3-difluoro-4-(4-pentylcyclohexyl)phenoxy]-2-methyl-propan-1-ol as colourless crystals.

$^{1}$H NMR (400 MHz, DMSO-d$_6$) δ ppm 0.85 (3H, t, J=7.0 Hz), 0.93 (3H, d, J=7.0 Hz), 0.96-1.08 (2H, m), 1.12-1.34 (9H, m), 1.43 (2H, qd, J=12.5, 2.2 Hz), 1.67-1.84 (4H, m), 1.92-2.02 (1H, m), 2.61-2.72 (1H, m), 3.35-3.43 (2H, m), 3.86 (1H, dd, J=9.4, 6.4 Hz), 3.99 (1H, dd, J=9.4, 5.9 Hz), 4.60 (1H, t, J=5.3 Hz), 6.88-6.96 (1H, m), 6.96-7.04 (1H, m).

Step 2: 1-[(2R)-3-bromo-2-methyl-propoxy]-2,3-difluoro-4-(4-pentylcyclohexyl)benzene

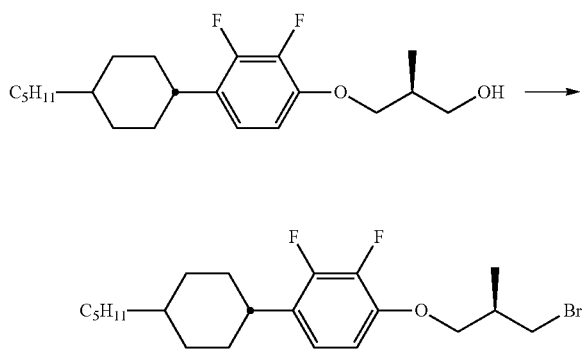

(2S)-3-[2,3-difluoro-4-(4-pentylcyclohexyl)phenoxy]-2-methyl-propan-1-ol (8.16 g, 23.02 mmol) is dissolved in dichloromethane (82.0 mL) and triphenylphosphine (6.64 g, 25.32 mmol, 1.1 eq) is added under nitrogen. The solution is cooled with ice and carbon tetrabromide (8.40 g, 25.32 mmol,) is added in portions over 10 minutes. The cooling is removed and the solution is allowed to warm to room temperature. After 4 hours triphenylphosphine (0.60 g) and carbon tetrabromide (0.76 g) are added and the solution is stirred at room temperature overnight. The reaction mixture is concentrated to dryness, heptane (175 mL) is added and stirred at 50° C. for 1 hour and the solids are filtered off and washed with heptane (2×125 mL). The filtrates are concentrated to dryness and the suspension is filtered through silica to give 1-[(2R)-3-bromo-2-methyl-propoxy]-2,3-difluoro-4-(4-pentylcyclohexyl)benzene as a colourless oil.

$^{1}$H NMR (400 MHz, CDCl$_3$) δ ppm 0.91 (3H, t, J=7.0 Hz), 1.01-1.14 (2H, m), 1.16 (3H, d, J=6.8 Hz), 1.19-1.38 (9H, m), 1.44 (2H, qd, J=12.8, 3.3 Hz), 1.80-1.92 (4H, m), 2.29-2.41 (1H, m), 2.75 (1H, tt, J=12.2, 2.9 Hz), 3.57 (1H, dd, J=10.0, 5.3 Hz), 3.62 (1H, dd, J=10.0, 5.2 Hz), 3.95-4.00 (2H, m), 6.65-6.75 (1H, m), 6.81-6.91 (1H, m).

Step 3: 1-[(2R)-3-diethoxyphosphoryl-2-methyl-propoxy]-2,3-difluoro-4-(4-pentylcyclohexyl)benzene

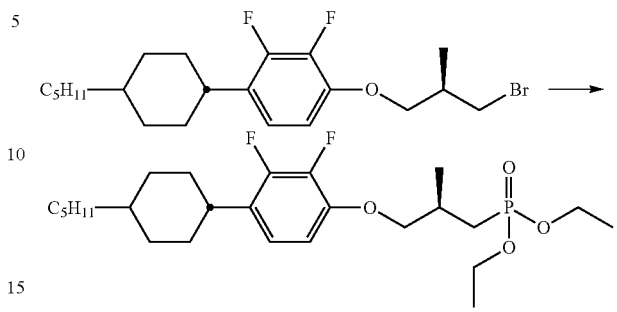

To a solution of diethyl phosphite (4.79 g, 34.72 mmol) in tetrahydrofuran (THF) (69 mL) under nitrogen is added sodium hydride (60%, 1.39 g,) in portions over 10 minutes and the mixture is stirred at room temperature for 45 min. A solution of 1-[(2R)-3-bromo-2-methyl-propoxy]-2,3-difluoro-4-(4-pentylcyclohexyl)benzene (6.90 g, 16.53 mmol) in THF (69 mL) is added to the mixture over 5 minutes. The mixture is then stirred at reflux overnight. The reaction mixture is added to 10% aq NH$_4$Cl (180 mL) and stirred for 10 min. Methyl-tert.-butyl ether (300 mL) is added and the layers separated. The organics are dried over MgSO$_4$ and concentrated to dryness to give an oil which is purified on silica eluting with ethyl acetate (0-10%)/dichloromethane to give 1-[(2R)-3-diethoxyphosphoryl-2-methyl-propoxy]-2,3-difluoro-4-(4-pentylcyclohexyl)benzene as a pale yellow oil.

$^{1}$H NMR (400 MHz, CDCl$_3$) δ ppm 0.89 (3H, t, J=7.0 Hz), 0.99-1.13 (2H, m), 1.15-1.51 (19H, m), 1.70 (1H, ddd, J=18.4, 15.4, 7.8 Hz), 1.77-1.92 (4H, m), 2.10 (1H, ddd, J=18.9, 15.4, 5.7 Hz), 2.32-2.49 (1H, m), 2.73 (2H, tt, J=12.1, 3.0 Hz), 3.86-3.97 (2H, m), 4.01-4.20 (4H, m), 6.62-6.71 (1H, m), 6.78-6.88 (1H, m).

$^{31}$P NMR (162 MHz, CDCl$_3$) δ ppm 30.77 (s).

Step 4: [(2R)-3-[2,3-difluoro-4-(4-pentylcyclohexyl)phenoxy]-2-methyl-propyl]phosphonic acid

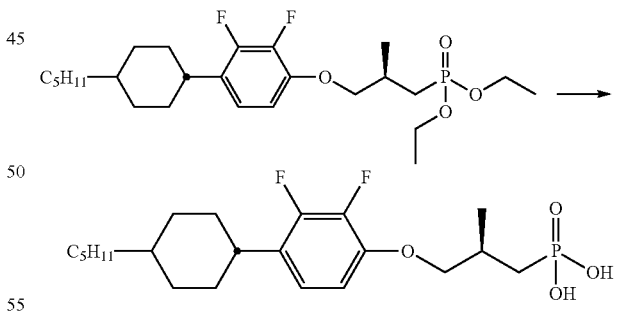

To a solution of 1-[(2R)-3-diethoxyphosphoryl-2-methyl-propoxy]-2,3-difluoro-4-(4-pentylcyclohexyl)benzene (8.70 g, 18.3 mmol) in dichloromethane (131 mL) trimethylsilyl bromide (24.3 mL, 183 mmol) is added dropwise over 10 minutes and the solution is stirred overnight at room temperature. The reaction mixture is concentrated to dryness to give a yellow waxy solid. The solid is dissolved in dichloromethane (200 mL) and methanol (150 mL) and the dichloromethane is removed slowly at 40° C. under a slight vacuum. The solution is cooled to room temperature and then in the freezer overnight and stirred in an ice/water bath for 1 hr. The precipitate is filtered and dried dry giving an off-white solid. 2M HCl (5 mL) is added to the filtrates and after stirring in an ice/acetone bath for 15 minutes the precipitate is filtered giving a white solid. The two batches of material are combined and recrystallized from acetonitrile (16 vols) and THF (1 vol). The precipitate is filtered and washed with acetonitrile (2×15 mL) and dried to give [(2R)-3-[2,3-difluoro-4-(4-pentylcyclohexyl)phenoxy]-2-methyl-propyl]phosphonic acid as a white solid.

$^{1}$H NMR (400 MHz, CD$_3$OD) δ ppm 0.91 (3H, t, J=7.0 Hz), 1.01-1.14 (2H, m), 1.21 (3H, d, J=6.8 Hz), 1.22-1.40 (9H, m), 1.42-1.56 (2H, m), 1.66 (1H, ddd, J=18.2, 15.3, 8.0 Hz), 1.76-1.94 (4H, m), 2.03 (1H, ddd, J=18.9, 15.3, 5.4 Hz), 2.29-2.46 (1H, m), 2.73 (1H, tt, J=12.2, 3.1 Hz), 3.88-4.03 (2H, m), 6.78-6.88 (1H, m), 6.88-6.98 (1H, m).

$^{19}$F NMR (377 MHz, CD$_3$OD) δ ppm-162.51 (d, J=19.1 Hz), −146.22 (d, J=19.1 Hz).

$^{31}$P NMR (162 MHz, CD$_3$OD) δ ppm 28.44.

Example 3

Step 1: 2,3-difluoro-4-[(2S)-2-methyloctoxy]benzaldehyde

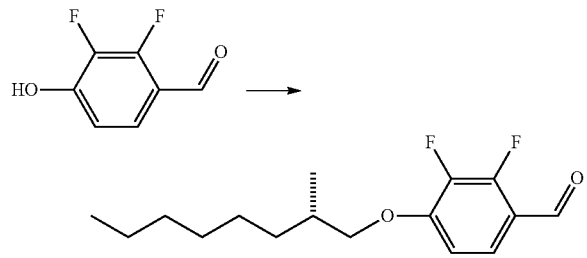

Step 2: 2,3-difluoro-4-[(2S)-2-methyloctoxy]phenol

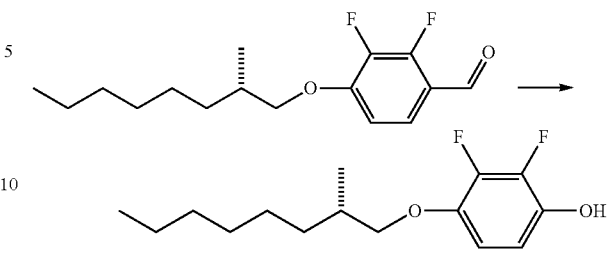

2,3-difluoro-4-[(2S)-2-methyloctoxy]benzaldehyde (9.70 g, 34.11 mmol), dichloromethane (97.0 mL) and mCPBA (70%, 10.51 g, 60.92 mmol) are stirred at 25° C. overnight. The reaction mixture is filtered, the filtrates concentrated to dryness and then re-dissolved in tetrahydrofuran (93 mL). A solution of LiOH·H$_2$O (4.06 g, 96.87 mmol) in water (97 mL) is added to the THF solution in one portion and the solution is stirred at 25° C. for 1 hour. HCl (0.2M, 500 mL) is added in portions and stirred for 1 hour. The mixture is extracted with MTB ether (2×250 mL) and the combined organics are washed with brine (2×250 mL), dried (MgSO$_4$) and concentrated to dryness giving a beige solid. Heptane (100 mL) is added, stirred for 15 mins, then the solids are filtered off and washed with heptane (3×15 mL). The filtrates were concentrated to dryness giving a brown oil (9.3 g). This is purified on silica eluting with dichloromethane/heptane (0-35%) giving 2,3-difluoro-4-[(2S)-2-methyloctoxy]phenol as a pale yellow oil which crystallised on standing.

$^{1}$H NMR (400 MHz, DMSO-d$_6$) δ ppm 0.81-0.91 (3H, m), 0.94 (3H, d, J=6.7 Hz), 1.08-1.38 (9H, m), 1.38-1.51 (1H, m), 1.75-1.91 (1H, m), 3.73 (1H, dd, J=9.4, 6.7 Hz), 3.81 (1H, dd, J=9.4, 5.8 Hz), 6.66 (1H, td, J=9.2, 2.2 Hz), 6.78 (1H, td, J=9.2, 2.2 Hz), 9.77 (1H, s).

Step 3: 1-(11-diethoxyphosphorylundecoxy)-2,3-difluoro-4-[(2S)-2-methyloctoxy]benzene

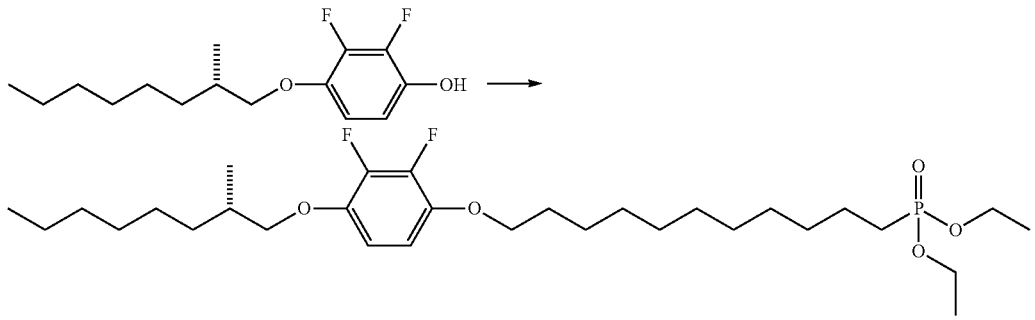

To a solution of 2,3-difluoro-4-hydroxybenzaldehyde (5.84 g, 36.94 mmol) and (S)-2-methyloctyl 4-methylbenzenesulfonate (12.68 g, 42.48 mmol) in dimethylformamide (59 mL) under nitrogen, potassium carbonate (20.42 g, 147.77 mmol, 4.00 eq) is added in one portion. The mixture is heated to 80° C. and stirred overnight. The reaction mixture is cooled, poured onto water (250 mL) and stirred for 5 mins. The mixture is extracted with heptane (2×250 mL) then the organics are combined and washed with water (2×250 mL), dried (MgSO$_4$) and concentrated to dryness giving a yellow oil which purified on silica eluting with dichloromethane (0-20%)/heptane to give 2,3-difluoro-4-[(2S)-2-methyloctoxy]benzaldehyde as a colourless oil.

To 2,3-difluoro-4-[(2S)-2-methyloctoxy]phenol (4.95 g, 181.18 mmol) in methylethyl ketone (65 mL) diethyl (11-bromoundecyl)phosphonate (6.75 g, 19.99 mmol) is added followed by potassium carbonate (10.05 g, 72.71 mmol) in one portion. The mixture is heated at reflux overnight, is filtered and concentrated to dryness to give a brown oil which is purified on silica eluting with ethyl acetate (0-20%)/dichloromethane to yield 1-(11-diethoxyphosphorylundecoxy)-2,3-difluoro-4-[(2S)-2-methyloctoxy]benzene.

$^{1}$H NMR (400 MHz, CDCl$_3$) δ ppm 0.82-0.96 (3H, m), 1.02 (3H, d, J=6.6 Hz), 1.09-1.88 (36H, m), 1.88-1.99 (1H, m), 3.74 (1H, m), 3.83 (1H, dd, J=9.0, 5.8 Hz), 3.97 (2H, t, J=6.5 Hz), 4.03-4.18 (4H, m), 6.61 (2H, m).

$^{31}$P NMR (162 MHz, CDCl$_3$) δ ppm 32.64.

Step 4: 11-[2,3-difluoro-4-[(2S)-2-methyloctoxy]phenoxy]undecylphosphonic acid

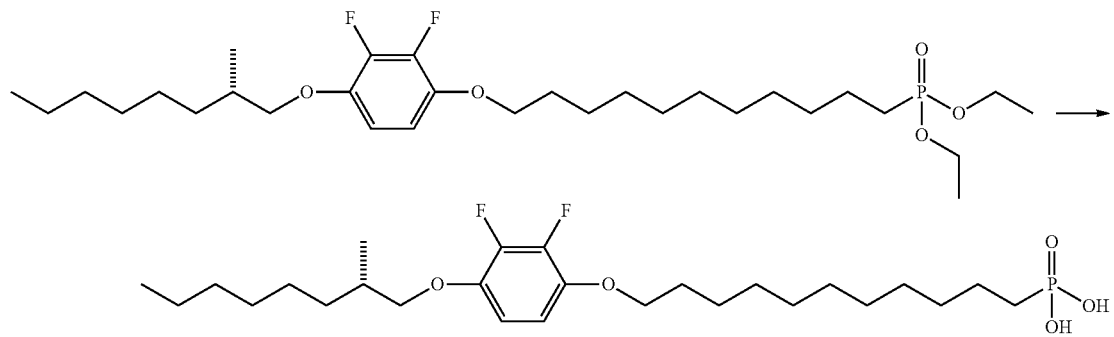

11-[2,3-difluoro-4-[(2S)-2-methyloctoxy]phenoxy]undecylphosphonic acid is obtained from 1-(11-diethoxyphosphorylundecoxy)-2,3-difluoro-4-[(2S)-2-methyloctoxy]benzene by treatment with trimethylsilyl bromide as described above for Example 2, Step 4, as colourless crystals.

$^1$H NMR (400 MHz, CD$_3$OD) δ ppm 0.88-0.98 (3H, m), 1.04 (3H, d, J=6.7 Hz), 1.18-1.74 (28H, m), 1.74-1.83 (2H, m), 1.92 (1H, m), 3.79 (1H, dd, J=9.2, 6.8 Hz), 3.86 (1H, dd, J=9.0, 5.8 Hz), 4.00 (2H, t, J=6.4 Hz), 6.77 (2H, m).

$^{19}$F NMR (376 MHz, CD$_3$OD) δ ppm −159.71 (d, J=17.7 Hz), −159.80 (d, J=17.7 Hz).

$^{31}$P NMR (162 MHz, CD$_3$OD) δ ppm 30.16.

In analogy to the above described syntheses the following compounds are obtained:

| Example No. | Compound |
|---|---|
| | 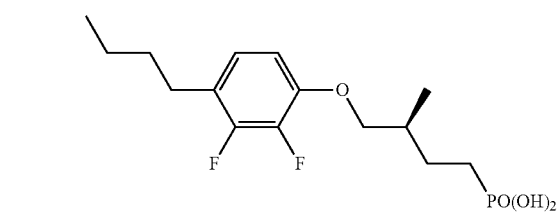 |
| | 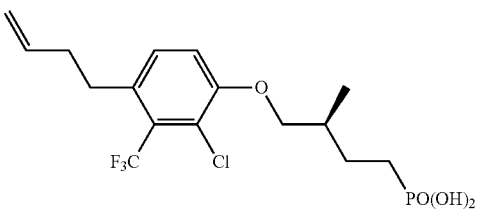 |
| | 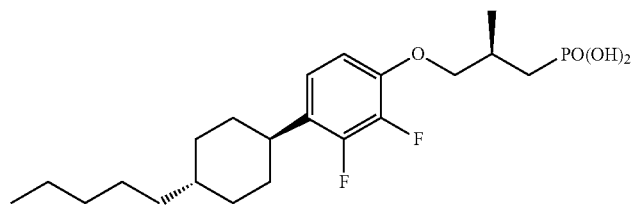 |
| | 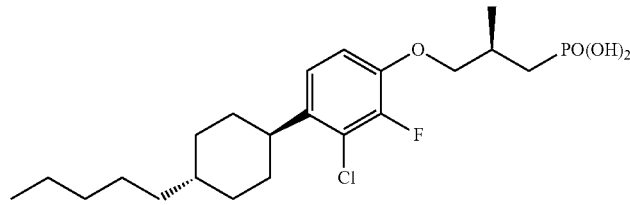 |

-continued
| Example No. | Compound |
|---|---|
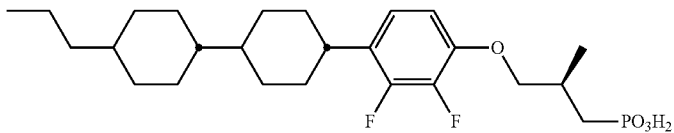
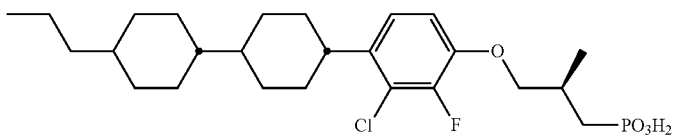
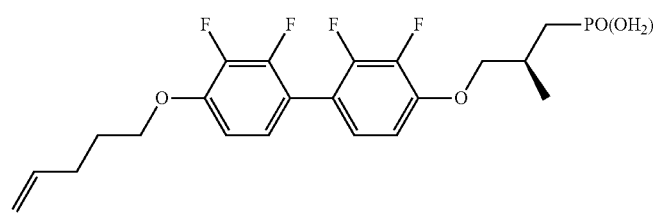
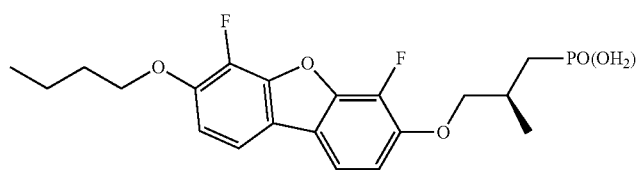
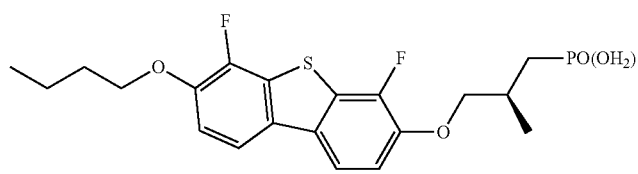
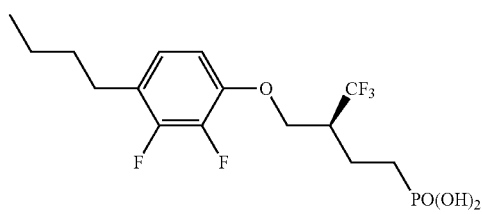
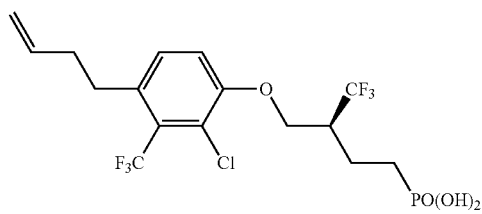
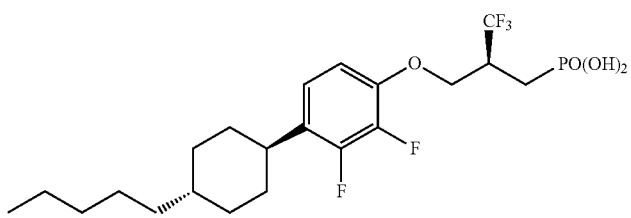

-continued
| Example No. | Compound |
|---|---|
| | 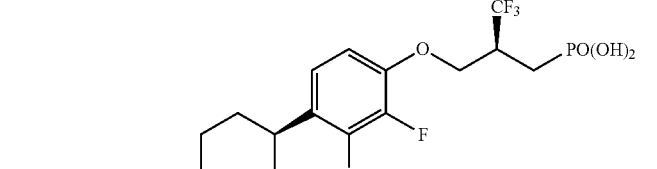 |
| | 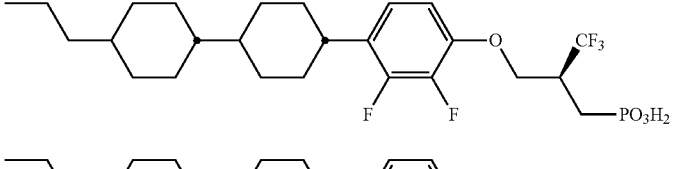 |
| | 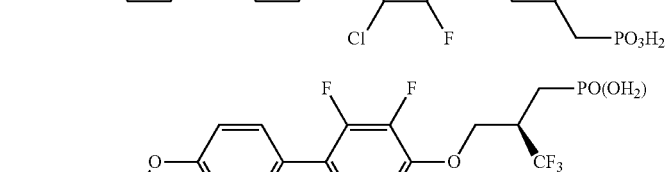 |
| | 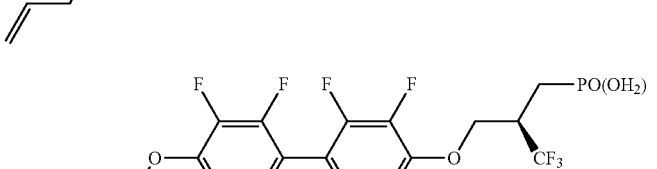 |
| | 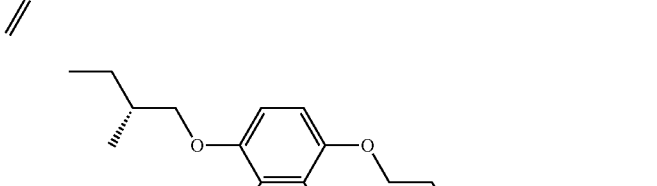 |
| | 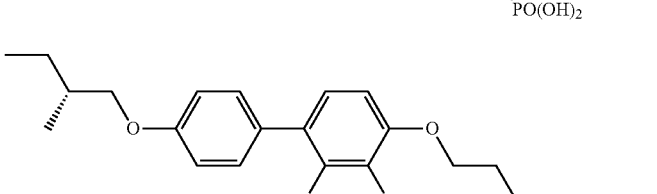 |
| | 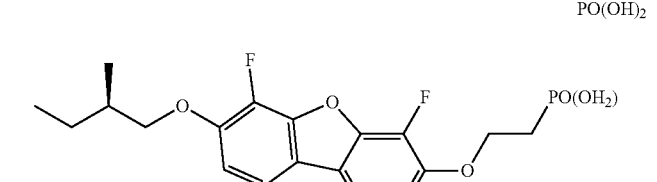 |
| | 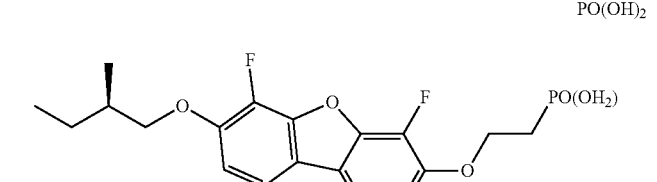 |

| Example No. | Compound |
| --- | --- |
| | 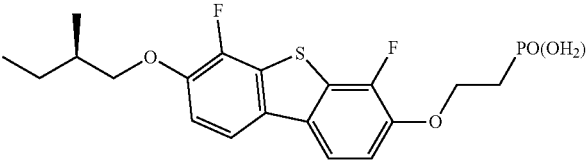 |

In the following description of the illustrative embodiments of the invention, identical or similar components and elements are denoted by identical or similar reference numbers, where repeated description of these components or elements is avoided in individual cases. The figures only depict the subject-matter of the invention diagrammatically.

FIG. 1A illustrates a nanoscale non-volatile solid state resistive device 100 having a molecular switching layer 103 according to an embodiment of the present invention. Device 100 is a two-terminal memory in the present embodiment. Device 100 includes a first electrode 102, a molecular switching layer 103, and a second electrode 104. Device 100 is a resistive memory device in the present embodiment, but may be other types of device in other embodiments. The molecular switching layer can be selectively set to various resistance values by applying a voltage to the electrodes and reset, using appropriate control circuitry. The resistance of the device 100 changes according to the orientation of the molecular dipoles of the molecular switching layer 103. Device 100 is formed over an outer semiconductor substrate 101. The semiconductor substrate may be a silicon substrate or a compound substrate of a III-V or II-VI type. In an embodiment, the substrate is not made of semiconductor material, e.g., made of plastic.

Particularly suitable substrates are selected from:
element semiconductors, such as Si, Ge, C (diamond, graphite, graphene, fullerene), α-Sn, B, Se and Te;
compound semiconductors, preferably
  group III-V semiconductors, in particular GaAs, GaP, InP, InSb, InAs, GaSb, GaN, TaN, TiN, MoN, WN, AlN, InN, $Al_xGa_{1-x}As$ and $In_xGa_{1-x}Ni$,
  group II-VI semiconductors, in particular ZnO, ZnS, ZnSe, ZnTe, CdS, CdSe, CdTe, $Hg_{(1-x)}Cd_{(x)}Te$, BeSe, $BeTe_x$ and HgS;
  group III-VI semiconductors, in particular GaS, GaSe, GaTe, InS, $InSe_x$ and InTe,
  group I-III-VI semiconductors, in particular $CuInSe_2$, $CuInGaSe_2$, $CuInS_2$ and $CuInGaS_2$,
  group IV-IV semiconductors, in particular SiC and SiGe,
  group IV-VI semiconductors, in particular SeTe;
organic semiconductors, in particular polythiophene, tetracene, pentacene, phthalocyanines, PTCDA, MePTCDI, quinacridone, acridone, indanthrone, flaranthrone, perinone, $AlQ_3$, and mixed systems, in particular PEDOT:PSS and polyvinylcarbazole/TLNQ complexes;
metals, in particular Ta, Ti, Co, Mo, Pt, Ru, Au, Ag, Cu, Al, W and Mg;
conductive oxidic materials, in particular indium tin oxide (ITO), indium gallium oxide (IGO), InGa-α-ZnO (IGZO), aluminium-doped zinc oxide (AZO), tin-doped zinc oxide (TZO), fluorine-doped tin oxide (FTO) and antimony tin oxide.

Preference is given to the use of crystalline silicon as substrate 101, where silicon wafers having a (100) surface are particularly preferred. Silicon wafers whose surface is oriented at (100) are employed as conventional substrate in microelectronics and are available in high quality and with a low proportion of surface defects.

In the switching devices according to the invention, the molecules of the molecular layer 103 are bonded to the first electrode 102 by means of the anchoring group G as defined above.

Figure 1B:
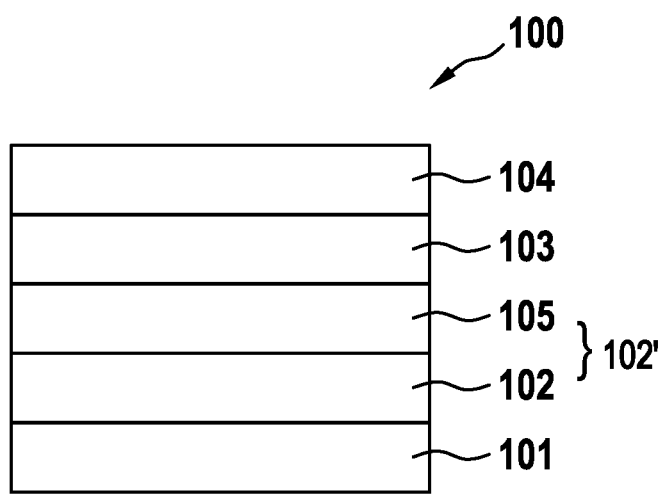
FIG. 1B shows a schematic illustration of the layer structure of a second embodiment of the electronic switching device according to the invention.

The molecular layer may optionally be bonded to a relatively thin (preferably 0.5-5 nm thick) oxidic interlayer 105, for example $TiO_2$, $Al_2O_3$, $ZrO_2$, $HfO_2$, or $SiO_2$, which is located on the first electrode 102, thus in this embodiment, the first electrode comprises a first layer comprising the material defined in claim 1 and a second oxidic layer to which the molecular layer 103 is bonded (FIG. 1B). Hence, first electrode 102 and interlayer 105 are operable as an alternative first electrode 102'.

The molecular layer of the present invention is a layer of electrically insulating, non-conducting and non-semiconducting organic compounds.

The molecular layer is essentially formed from precursors of the formulae IA, IB and/or IC. Preferably, the precursors used for the formation of the molecular layer consist of compounds of the formulae IA, IB and/or IC.

The thickness of the molecular layer is preferably 10 nm or less, particularly preferably 5 nm or less, very particularly preferably 3 nm or less.

The molecular layer may consist of one, two, three or more molecule layers comprising compounds of the formulae IA, IB and/or IC.

The molecular layer employed in accordance with the invention is preferably a molecular monolayer.

In an embodiment, the molecular layer is a self-assembled monolayer (SAM).

The production of self-assembled monolayers is known to the person skilled in the art; a review is given, for example, in A. Ulman, Chem. Rev. 1996, 96, 1533-1554.

The degree of coverage of the substrate is preferably 90% to 100%, particularly preferably 95% to 100%, very particularly preferably 98% to 100%.

Preferably, the second electrode 104 consists of TiN.

In an embodiment, first electrodes 102, which in the embodiment of FIG. 1A are implemented in the form of conductor tracks which run perpendicular to the drawing plane, are arranged on the substrate 101.

A second electrode 104, which, like the first electrode 102, is in the form of a conductor track, is arranged on the side of the molecular layer 103 facing away from the substrate 101. However, the second electrode 104 is rotated by 90° relative to the first electrode 102, so that a cross-shaped arrangement arises. This arrangement is also called a crossbar array, where the 90° angle is selected here as an example and arrangements in which second electrodes 104 and first electrodes 102 cross at an angle deviating from the right angle are also conceivable. A switching device 100, which is formed from a layer system having, in this sequence, a second electrode 104, a molecular layer 103 and a first electrode 102, is arranged at each crossing point between a second electrode 104 and a first electrode 102. In an embodiment a diode is also assigned to each switching device 100.

The crossbar array enables each switching device 100 to be addressed electrically by applying a voltage between the corresponding first electrode 102 and second electrode 104.

The production and structuring of the electrodes is carried out by means of processes known to the person skilled in the art and is explained in greater detail below with reference to the working examples.

The structures of the electrodes 102,104 can be produced by means of structuring methods known to the person skilled in the art from microelectronics. For example, a lithography method can be employed for the production of the first electrodes 102. In this, a metal layer is applied to the substrate 101 by means of vapour deposition. The metal layer is subsequently coated with a photoresist, which is exposed with the structures to be produced. After development and, where necessary, baking of the resist, the parts of the metal layer that are not required are removed, for example, by wet-chemical etching. The remaining resist is subsequently removed, for example using a solvent.

A further possibility for the production of the electrodes 102, 104 is vapour deposition with the aid of a shadow mask. In this method, a mask whose openings correspond to the shape of the electrodes 102,104 to be produced is placed on the component and a metal is subsequently applied by vapour deposition. The metal vapour is only able to precipitate and form the electrode 102, 104 on the component in the areas not covered by the mask.

FIGS. 2A to 2F illustrate a process for forming device 100.

Figure 2A:
FIG. 2A-F show schematic illustrations of the layer structures obtained in a first process for forming the electronic switching device according to the invention.

A substrate 101 whereon a plurality of devices 100 is to be defined is provided (FIG. 2A). The substrate is silicon (p doped, resistivity <0.001 $\Omega$ cm$^{-1}$, prime grade) in the present embodiment. In a preferred embodiment, the silicon substrate comprises a $SiO_2$ layer which serves as an isolating layer and improves derivatization. In other embodiments, other semiconductor materials such as III-V and II-VI type semiconductor compounds may be used as the substrate. Device 100 may be formed as part of a front-end process or a back-end process depending on implementation. Accordingly, substrate 101 may include one or more layers of material formed and patterned thereon when the substrate is provided for the present process.

A first electrode is formed over substrate 101 (FIG. 2A) using any deposition process, such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), and/or sputtering, or another deposition or growth process to form at least a top portion of the first electrode. The bottom electrode preferably should comprise a material having a high voltage threshold for ion migration and it can be blanket or structured by photolithography or other advanced lithography processes known to a person skilled in the art, e.g. nano-imprint lithography or dip-pen lithography.

Optionally, the first electrode is treated with oxygen, argon or nitrogen plasma or UV/ozone in order to obtain a hydrophilic oxidic surface which is populated with hydroxyl groups. It is clear that an oxidic surface of this type merely serves for surface modification with the aim of possible derivatisation via condensation reactions and does not represent an insulator layer or interlayer in the true sense. Sufficiently large tunnel currents through this oxidic surface are possible owing to the low thickness in the order of 1 nm.

Figure 2B:
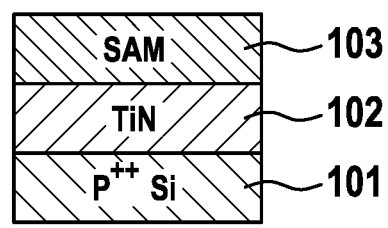
Figure 2C:
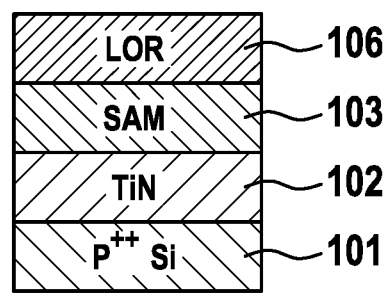
Figure 2D:
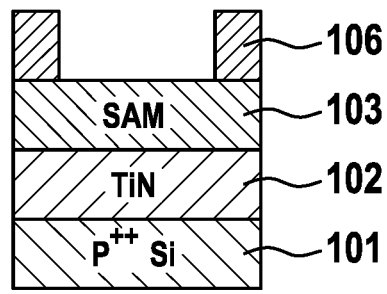
Figure 2E:
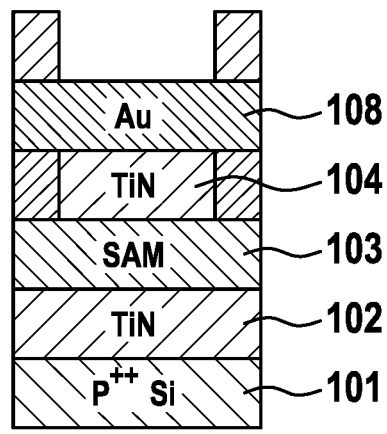
Figure 2F:
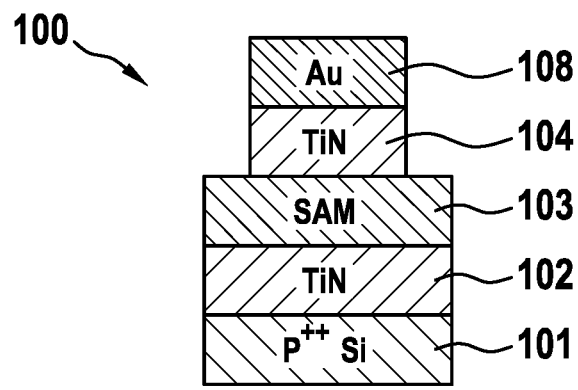

A molecular layer 103 is formed over the first electrode 102 (FIG. 2B).

The deposition of the molecular layer onto the first electrode is carried out with the pure substance or from solution, preferably from solution. Suitable deposition methods and solvents are known to the person skilled in the art; examples are spin coating or dip coating.

The molecules of the molecular layer are preferably bonded to the first electrode by chemisorption or covalently, more preferably covalently. The bonding is carried out by known methods which are familiar to the person skilled in the art, for example by condensation with hydroxyl groups located on the surface of the substrate. In an alternative embodiment, the molecular layer 103 can also be linked to a first electrode not directly but via a thin oxidic adhesion layer 105 derived from a metal different from that of the first electrode (e.g. $Al_2O_3$, $ZrO_2$) and which is deposited onto the first electrode using the deposition techniques mentioned above for the first electrode, preferably CVD.

Preferred is grafting of a molecular layer directly onto a titanium nitride first electrode 102 by means of molecules of formula IA, IB and/or IC in which the anchor group G is a phosphonic acid group.

In a preferred embodiment, the device is annealed after deposition of the monolayer. The annealing is carried out at a temperature of greater than 20° C. and less than 300° C., preferably at greater than 50° C. and less than 200° C., particularly preferably at greater than 90° C. and less than 150° C. The time duration of the annealing is 1 to 48 h, preferably 4 to 24 h, particularly preferably 8 to 16 h.

According to another aspect of the invention the monolayer is fabricated from one or more compounds of formulae IA, IB and/or IC in which the anchor group G denotes $—SO_2OR^V$, $—OP(O)(OR^V)_2$, $—PO(OR^V)_2$, $—C(OH)(PO(OR^V)_2)_2$, $—COOR^V$ or $—Si(OR^V)_3$ where $R^V$ denotes alkyl having 1 to 20 C atoms, preferably a secondary or tertiary alkyl having up to 20 C atoms. These compounds are distinguished by a particularly high solubility and are well suitable for industrial processes such as spin coating. In addition, it is possible to process these compounds by gas phase deposition. The compounds serve as precursors for the corresponding free acids which are obtained in situ by thermal treatment of the compounds after deposition onto the first electrode. The first electrode is then heated to a temperature between 60° C. and 300° C., preferably between 100° C. and 250° C., in particular between 140° C. and 180° C.

Referring to FIG. 2A, the first electrode 102 is patterned to obtain an electrode extending along a direction (e.g., horizontal direction), Although not shown, a plurality of first electrodes extending along the first direction in parallel is formed at this step.

Referring to FIG. 2C to 2F, patterned second electrodes are formed on the molecular layer 103 by a lift-off process using a known processing sequence including a lift-off photoresist (LOR, 106) patterning step, electrode deposition, and lift off, or, as depicted in FIG. 3A-D using a photoresist (PR) 107.

The second electrode 104, preferably a titanium nitride second electrode 104, can be deposited, e.g., by sputtering or atomic layer deposition, preferably by sputtering.

In other embodiments, the second electrode 104 can be a stacked structure. For example, a metal contact 108 (e.g., Au) of about 10 to 100 nm can be deposited on top of the TiN layer. The thickness may vary depending on the device size and implementation. Although gold or aluminium is used in the present embodiment, it will be understood that the top electrode contact 108 can be formed from various other suitable metals, such as silver (Ag), nickel (Ni), chromium (Cr), iron (Fe), manganese (Mn), tungsten (W), vanadium (V), cobalt (Co), ruthenium (Ru) or a metal stack (or stacks).

EXAMPLES

The fabrication of the test devices follows industry-typical standard procedures. The titanium nitride is deposited by reactive sputtering (Ti target, in N2 atmosphere), by sputtering using a TiN target order by PE-ALD.

Formation of a Monolayer on a First Electrode

A silicon wafer 101 coated with a 50 nm thick layer of TiN deposited by reactive sputtering is activated by ozone/UV treatment (110 W/300 s) and subsequently immersed into a 1 mM solution of the phosphonic acid PA1 (vide supra) in tetrahydrofuran (THF) for 24 h. The chip is removed from the immersion bath, blown dry with nitrogen and annealed under nitrogen at 120° C. for 60 min. Then, the chip is rinsed with THF on a the spin-coater and subsequently annealed again under nitrogen at 120° C. for 5 min.

Second Electrode Deposition

A TiN top electrode is deposited by sputtering onto the molecular layer with a CFS-4EP-LL (Shibaura Mechatronics) using a TiN target (purity level 3NS), at a pressure of 0.5 Pa, RF power 200 W, stage temperature: 20° C., $Ar/N_2$ flow=8.5/1.5 sccm After 7 min a layer thickness of 20 nm is obtained.

Aluminium 108 (300 nm; for dry etch process) or gold 108 (300 nm; for lift-off process) layers are applied by sputtering with the CFS-4EP-LL (Shibaura Mechatronics) using a Al target (purity level 3N) or Au target (purity level 3N), at a pressure of 0.5 Pa, RF power 200 W, stage temperature: 20° C., Ar flow=10 sccm. After 20 min a layer thickness of 300 nm is obtained. After addition of this layer on top of the TiN 104, the device depicted in FIG. 3D is obtained.

Patterned top electrodes are fabricated as follows.

Patterning by Lift-Off Process

The substrate comprising the TiN layer 102 and the molecular layer 103 (FIG. 2A) is heated at 100° C. for 180 s, followed by exposure to hexamethyldisilazane (HMDS) vapour for 120 s at 20° C.

A Lift-off resist (LOR) 106 (LOR7A, Microchem) is deposited onto the molecular layer 103 by spin-coating (300 rpm/20 s; 3500 rpm/20 s) and heated at 180° C. for 300 s, followed by spin-coating of photoresist (AZ5214E, EMD Performance Materials) onto the LOR 106. After heating at 90° C. for 60 sec, the device is exposed inside a maskless aligner at 365 nm (i-line) and the photoresist is developed with tetramethylammonium hydroxide (NMD-3 2.38%, Tokyo Ohka Kogyo for 60 sec. Water rinse and heating at 100° C. for 120 sec gives the intermediate device depicted in FIG. 2D. TiN is deposited by sputtering (TiN target (purity level 3NS), pressure 0.5 Pa, RF power 200 W, stage temperature: room temp., no heating, Ar/N2 flow=8.5/1.5 sccm) followed by deposition of Au by sputtering under standard conditions. Lift-off is done by 12 h dip in Remover 1165 (MicroChem) followed by light wipe in remover by BEMCOT (industrial wiper, Asahi Kasei), acetone rinse (dip and splay), isopropanol rinse (dip and splay) and drying in a flow of nitrogen.

Patterning by Dry Etch Process (FIG. 3A-D)

Figure 3A:
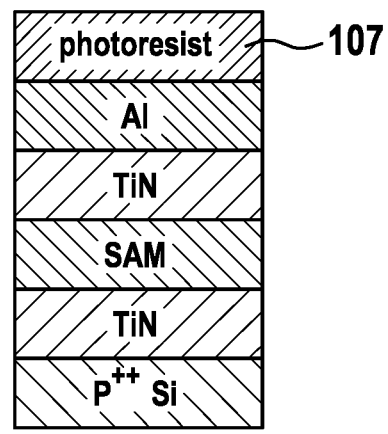
FIG. 3A-D show schematic illustrations of the layer structures obtained in a second process for forming the electronic switching device according to the invention.
Figure 3B:
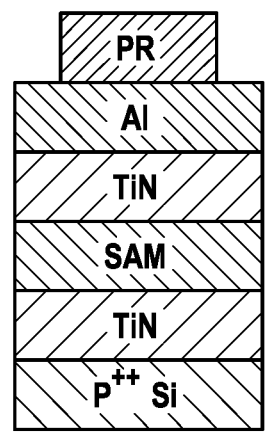
Figure 3C:
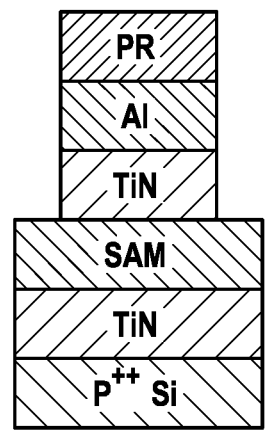
Figure 3D:
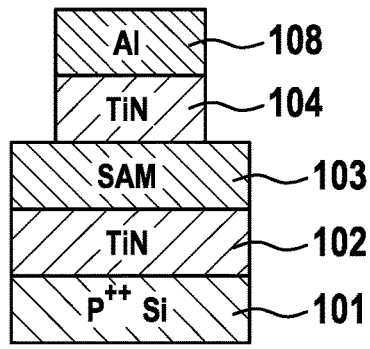

The device shown in FIG. 3A, obtained as described above, is exposed to HMDS vapour at 20° C. for 120 s. Photoresist 107 (AZ5214E, EMD Performance Materials) is deposited by spin coating onto the aluminium top contact 108, heated at 90° C. for 60 s, and exposed to UV using the Maskless Lithography System (Nano Systems Solutions) (reverse pattern). Development with NMD3 for 60 sec, water rinse and heating at 100° C. for 120 s gives the intermediate of FIG. 3C, which is transferred into the final device of FIG. 3D by dry etching with chlorine (pressure=0.5 Pa, ICP 150 W, bias 50 W, T=20° C., processing time=37-52 sec) followed by oxygen ($O_2$ flow 20 sccm, pressure=10 Pa, ICP 500 W, bias 0 W, stage temperature 20° C., processing time 30 min).

Electrical Characterization

Figure 4:
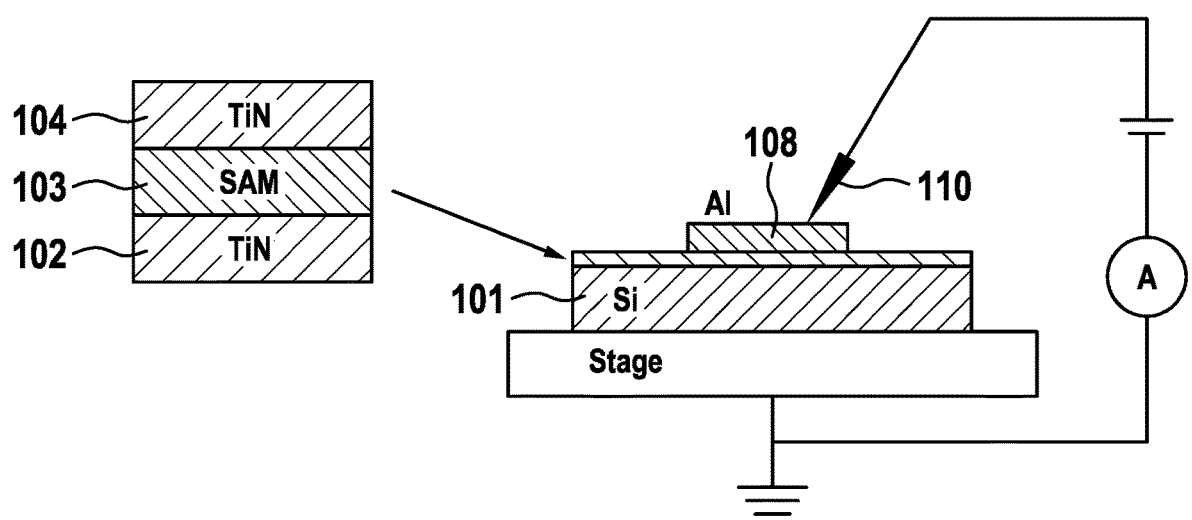
FIG. 4 shows a schematic illustration for an experimental setup for the electrical characterization of an electronic switching device according to the invention.
Figure 5:
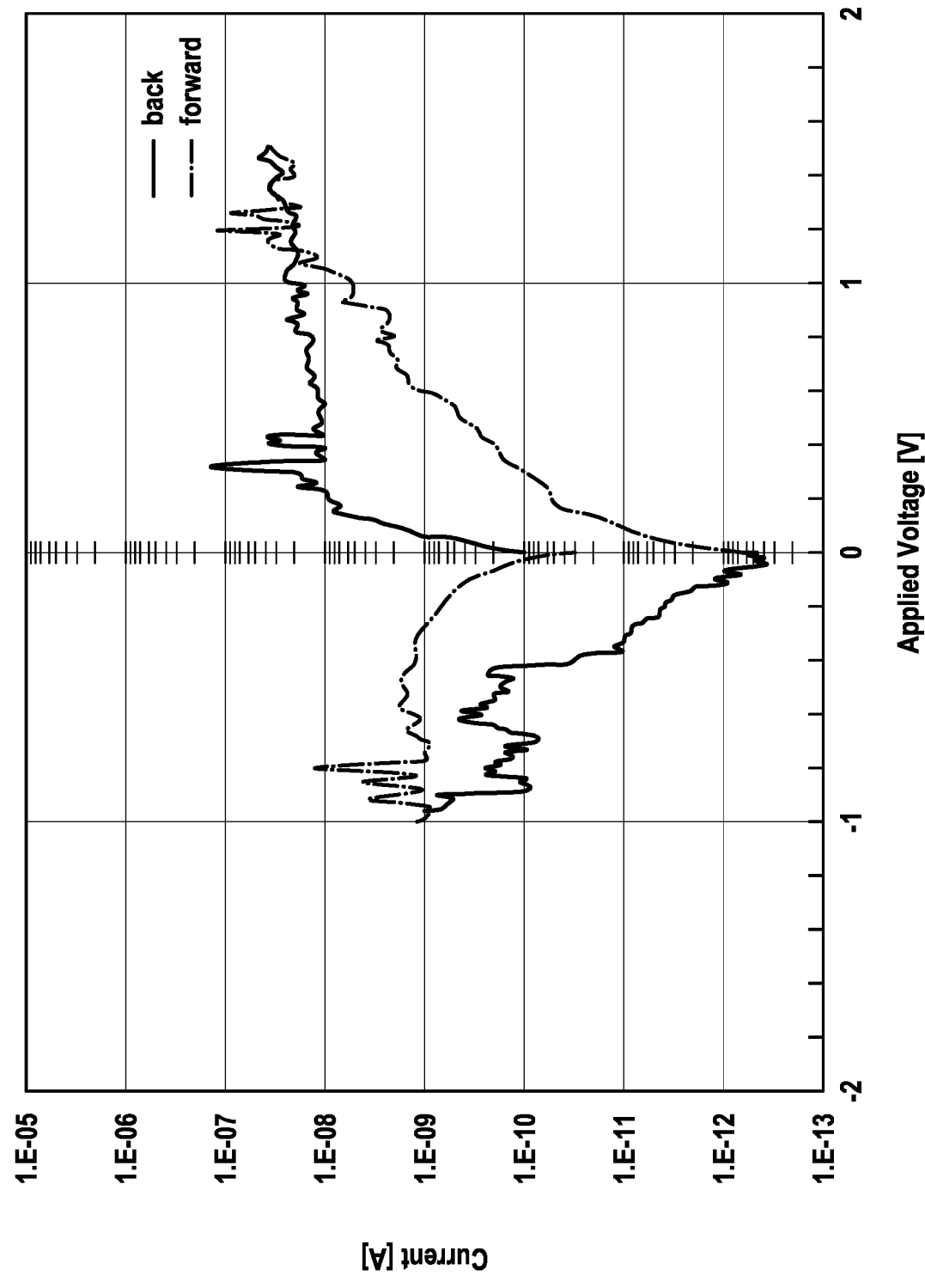
FIG. 5 shows a current-voltage curve of an electronic switching device according to the invention.

The electrical characterization of a switching device comprising a molecular layer obtained from the compound PA1 sandwiched between a TiN first electrode 102 on a silicon substrate 101 and a TiN second electrode 104 with aluminium contact 108 is done with a nanoprobe 110 (Hitachi High Technologies Nano-Probe N-6000SS, probe size ca. 1 μm) and an Agilent B1500 device analyzer under SEM control as shown in FIG. 4. A forward scan starts at 0V and the voltage is increased to +1.5 V, going back to 0V, then up to −1 V and back to 0V. The scan speed is 300 mV/s. The resulting current is measured and the result is shown in FIG. 5. The device has an advantageously large memory window.

FIG. 5 illustrates resistance switching characteristics of device 100 according to an embodiment of the present invention. The device shows hysteretic switching. The resistance of the switching layer changes depending on the polarity and magnitude of the signal applied to the switching medium via the top and bottom electrodes. The device is changed into ON-state (low resistance state) when a positive voltage equal to or greater than a threshold voltage Vth is applied. In an embodiment, the threshold voltage ranges between 0.5 V to 1 V depending on the materials used for the switching medium and the top electrode. The device is switched back to OFF-state (high resistance state) when a negative voltage of equal or greater magnitude than erase threshold voltage (or erase voltage) $V_{eth}$ is applied. In an embodiment, the erase voltage ranges from −0.5 V to −1 V. The device state is not affected if the bias applied is between two threshold voltages $V_{pth}$ and $V_{eth}$, which enables the low-voltage read process. Once device 100 is set to a specific resistance state, the device retains the information for a certain period (or retention time) without electrical power. In an embodiment, device 100 exhibits controllable ON-state current flow of 1 to 100 nA and a memory window of greater than 10 at a read-out voltage of 0.5 V.

The invention claimed is:

1. An electronic switching device (100) comprising, in this sequence,
   a first electrode (102),
   a molecular layer (103) bonded to the first electrode, and
   a second electrode (104),
   where the first and second electrodes comprise a metal nitride, and
   where the molecular layer is formed from one or more compounds selected from formulae IA, IB and IC:

R$^{1A}$-(A$^1$-Z$^1$)$_r$—B$^1$—(Z$^2$-A$^2$)$_s$-Sp$^A$-G  (IA)

D$^1$-Z$^D$-(A$^1$-Z$^1$)$_r$—B$^1$—(Z$^2$-A$^2$)$_s$-Sp-G  (IB)

R$^{1C}$-(A$^1$-Z$^1$)$_r$—B$^1$—Z$^L$-A$^{2C}$-(Z$^3$-A$^3$)$_s$-G  (IC)

in which
R$^{1A}$, R$^{1C}$ denote straight chain or branched alkyl or alkoxy each having 1 to 20 C atoms, where one or more CH$_2$ groups in these radicals may each be replaced, independently of one another, by —C≡C—, —CH=CH—,

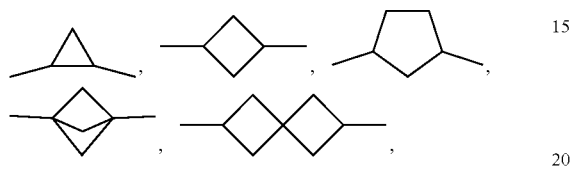

—O—, —S—, —CF$_2$O—, —OCF$_2$—, —CO—O—, —O—CO—, —SiR$^0$R$^{00}$—, —NH—, —NR$^0$— or —SO$_2$— in such a way that O atoms are not linked directly to one another, and in which one or more H atoms may be replaced by halogen, CN, SCN or SF$_5$, where R$^{1C}$ alternatively denotes a group D$^1$-Z$^D$,
Z$^D$ has one of the meanings of Z$^1$, Z$^2$ and Z$^3$ or denotes a spacer group,
Z$^1$, Z$^2$, Z$^3$ on each occurrence, identically or differently, denote a single bond, —CF$_2$O—, —OCF$_2$—, —CF$_2$S—, —SCF$_2$—, —CH$_2$O—, —OCH$_2$—, —C(O)O—, —OC(O)—, —C(O)S—, —SC(O)—, —(CH$_2$)$_{n1}$—, —(CF$_2$)$_{n2}$—, —CF$_2$—CH$_2$—, —CH$_2$—CF$_2$—, —CH=CH—, —CF=CF—, —CF=CH—, —CH=CF—, —(CH$_2$)$_{n3}$O—, —O(CH$_2$)$_{n4}$—, —C≡C—, —O—, —S—, —CH=N—, —N=CH—, —N=N—, —N=N(O)—, —N(O)=N— or —N=C—C=N—,
n1, n2, n3, n4 identically or differently, are 1, 2, 3, 4, 5, 6, 7, 8, 9 or 10,
Z$^L$ denotes —O—, —S—, —CH$_2$—, —C(O)—, —CF$_2$—, —CHF—, —C(R$^x$)$_2$—, —S(O)— or —SO$_2$—,
R$^0$, R$^{00}$, identically or differently, denote an alkyl or alkoxy radical having 1 to 15 C atoms, in which, in addition, one or more H atoms may be replaced by halogen,
D$^1$ denotes a diamondoid radical,
A$^1$, A$^2$, A$^3$ on each occurrence, identically or differently, denote an aromatic, heteroaromatic, alicyclic or heteroaliphatic ring having 4 to 25 ring atoms, which may also contain condensed rings and which may be mono- or polysubstituted by Y,
A$^{2C}$ denotes an aromatic or heteroaromatic ring having 5 to 25 ring atoms, which may also contain condensed rings and which may be mono- or polysubstituted by Y$^C$,
Y on each occurrence, identically or differently, denotes F, Cl, CN, SCN, SF$_5$ or straight-chain or branched, in each case optionally fluorinated alkyl, alkoxy, alkylcarbonyl, alkoxycarbonyl, alkylcarbonyloxy or alkoxycarbonyloxy having 1 to 12 C atoms,
Y$^C$ on each occurrence, identically or differently, denotes F, Cl, CN, SCN, SF$_5$ or straight-chain or branched, in each case optionally fluorinated alkyl, alkoxy, alkylcarbonyl, alkoxycarbonyl, alkylcarbonyloxy or alkoxycarbonyloxy having 1 to 12 C atoms, or cycloalkyl or alkylcycloalkyl each having 3 to 12 C atoms, B$^1$ denotes

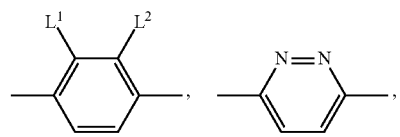

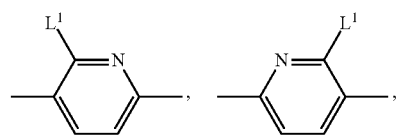

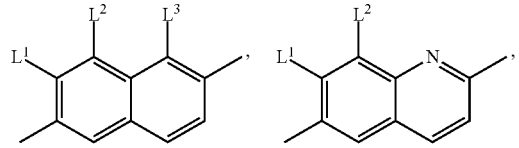

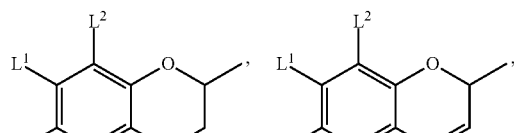

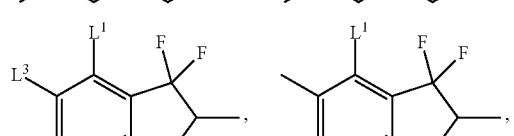

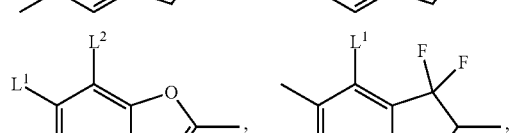

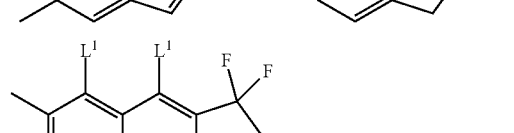

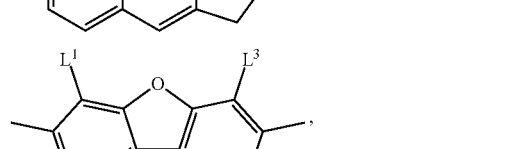

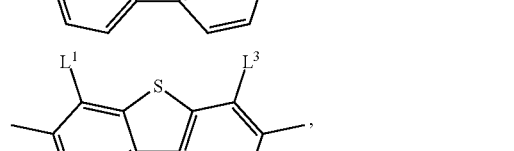

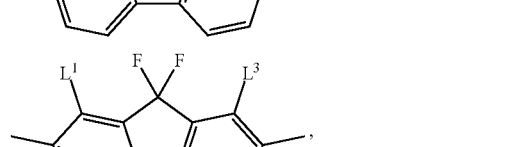

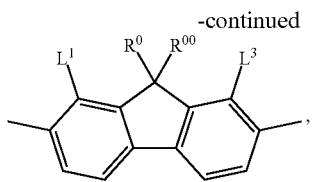

in which R⁰ and R⁰⁰ denote F or alkyl having 1 to 6 C atoms,

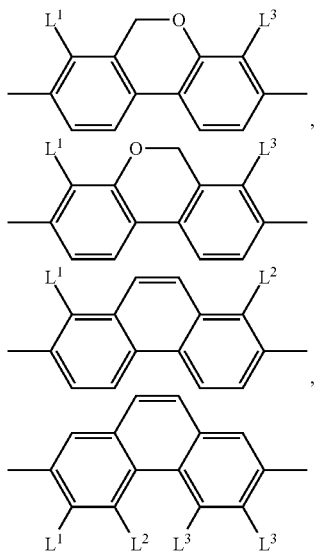

where the groups may be oriented in both directions,
$L^1$ to $L^3$, independently of one another, denote F, Cl, Br, I, CN, $SF_5$, $CF_3$ or $OCF_3$, where $L^3$ may alternatively also denote H,
$Sp^A$ denotes a spacer group or a single bond,
Sp denotes a spacer group,
G denotes —OH, —CH(CH₂OH)₂, —C(CH₂OH)₃, —SH, —SO₂OH, —OP(O)(OH)₂, —PO(OH)₂, —C(OH)(PO(OH)₂)₂, —COOH, —Si(OR$^x$)₃, —SiCl₃, SO₂OR$^V$, —OP(O)(OR$^V$)₂, —PO(OR$^V$)₂, —C(OH)(PO(OR$^V$)₂)₂, —COOR$^V$ or —Si(OR$^V$)₃,
R$^V$ denotes secondary or tertiary alkyl having 1 to 20 C atoms,
R$^x$ denotes straight-chain or branched alkyl having 1 to 6 C atoms, and
r, s on each occurrence, identically or differently, are 0, 1 or 2,
wherein at least one of the groups Sp$^A$ and R$^{1A}$ of the compounds of formula IA, or at least one of the groups Z$^D$ and Sp of the compounds of formula IB, or the group R$^{1C}$ of the compounds of formula IC, respectively, is chiral.

2. The electronic switching device (100) according to claim 1, wherein the first electrode (102) and the second electrode (104), identically or differently, comprise a metal nitride selected from the group consisting of CrN, HfN, MoN, NbN, TiN, TaN, WN, WCN, VN and ZrN.

3. The electronic switching device (100) according to claim 1, wherein the second electrode (104) consists of TiN.

4. The electronic switching device (100) according to claim 1, wherein an interlayer (105) is arranged between the first electrode (102) and the molecular layer (103), where the interlayer (105) comprises an oxidic material and where the molecular layer (103) is bonded to said oxidic material, and where the first electrode (102) and the interlayer (105) are operable as a first electrode (102').

5. The electronic switching device (100) according to claim 4, wherein the oxidic interlayer comprises TiO₂, Al₂O₃, ZrO₂, HfO₂, or SiO₂.

6. The electronic switching device (100) according to claim 1, wherein the group G in formula IA, IB or IC denotes —PO(OH)₂ or —C(OH)(PO(OH)₂)₂.

7. The electronic switching device (100) according to claim 1, wherein the group G of the compounds of the formulae IA, IB or IC is bonded to the first electrode (102) by chemisorption or covalently.

8. The electronic switching device (100) according to claim 1, wherein the molecular layer (103) is a molecular monolayer.

9. An electronic component comprising one or more switching devices (100) according to claim 1.

10. The electronic component according to claim 9, wherein the component has a multitude of switching devices (100), where the first electrodes (102) and second electrodes (104) of the switching devices (100) form a crossbar array.

11. The electronic component according to claim 9, wherein the switching devices (100) are configured to change between a state having high electrical resistance and a state having low electrical resistance, where the quotient between high electrical resistance and low electrical resistance is between 10 and 100,000.

12. The electronic component according to claim 9, wherein the component is a resistive memory device, a sensor, a field-effect transistor or a Josephson junction.

13. A method for operating an electronic component according to claim 9, wherein one or more of the switching devices (100) of the electronic component is switched into a state of high electrical resistance by setting a corresponding first electrode (102) to a first electrical potential and setting a corresponding second electrode (104) to a second electrical potential, where the value of the voltage between the two electrodes (102, 104) is greater than a first switching voltage and the first potential is greater than the second potential, a switching device (100) of the electronic component is switched into a state of low electrical resistance by setting a corresponding first electrode (102) to a third electrical potential and setting a corresponding second electrode (104) to a fourth electrical potential, where the value of the voltage between the two electrodes (102,104) is greater than a second switching voltage and the fourth potential is greater than the third potential, and the state of a switching device is determined by applying a reading voltage whose value is smaller than the first and second switching voltages between corresponding electrodes (102, 104) and measuring the current flow.

14. The electronic component according to claim 9, wherein the component is a memristive electronic component.

15. A process for production of the switching device (100) according to claim 1, comprising:
   i. producing the first electrode (102) comprising a metal nitride having a surface,
   ii. depositing the molecular layer (103) comprising one or more compounds selected from formulae IA, IB and IC onto the surface of the first electrode (102), and
   iii. applying the second electrode (104) comprising a metal nitride.

16. A compound of the formula IA

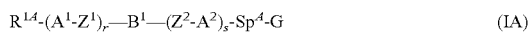

in which
R$^{1A}$ denotes straight chain or branched alkyl or alkoxy each having 1 to 20 C atoms, where one or more CH$_2$ groups in these radicals may each be replaced, independently of one another, by —C≡C—, —CH=CH—,

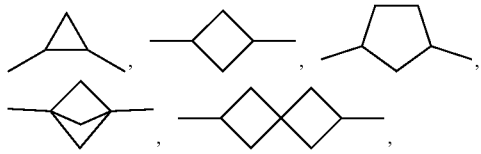

—O—, —S—, —CF$_2$O—, —OCF$_2$—, —CO—O—, —O—CO—, —SiR$^0$R$^{00}$—, —NH—, —NR$^0$— or —SO$_2$— in such a way that O atoms are not linked directly to one another, and in which one or more H atoms may be replaced by halogen, CN, SCN or SF$_5$, Z$^1$, Z$^2$ on each occurrence, identically or differently, denote a single bond, —CF$_2$O—, —OCF$_2$—, —CF$_2$S—, —SCF$_2$—, —CH$_2$O—, —OCH$_2$—, —C(O)O—, —OC(O)—, —C(O)S—, —SC(O)—, —(CH$_2$)$_{n1}$—, —(CF$_2$)$_{n2}$—, —CF$_2$—CH$_2$—, —CH$_2$—CF$_2$—, —CH=CH—, —CF=CF—, —CF=CH—, —CH=CF—, —(CH$_2$)$_{n3}$O—, —O(CH$_2$)$_{n4}$—, —C≡C—, —O—, —S—, —CH=N—, —N=CH—, —N=N—, —N=N(O)—, —N(O)=N— or —N=C—C=N—, n1, n2, n3, n4 identically or differently, are 1, 2, 3, 4, 5, 6, 7, 8, 9 or 10, R$^0$, R$^{00}$, identically or differently, denote an alkyl or alkoxy radical having 1 to 15 C atoms, in which, in addition, one or more H atoms may be replaced by halogen, A$^1$, A$^2$ on each occurrence, identically or differently, denote an aromatic, heteroaromatic, alicyclic or heteroaliphatic ring having 4 to 25 ring atoms, which may also contain condensed rings and which may be mono- or polysubstituted by Y, Y on each occurrence, identically or differently, denotes F, Cl, CN, SCN, SF$_5$ or straight-chain or branched, in each case optionally fluorinated alkyl, alkoxy, alkylcarbonyl, alkoxycarbonyl, alkylcarbonyloxy or alkoxycarbonyloxy having 1 to 12 C atoms, B$^1$ denotes

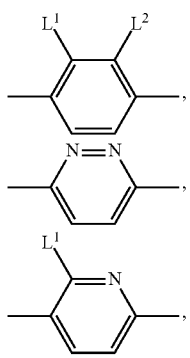

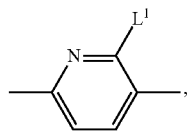

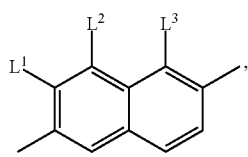

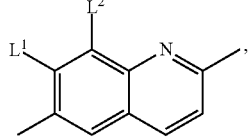

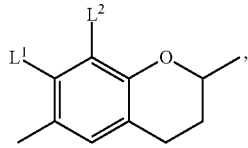

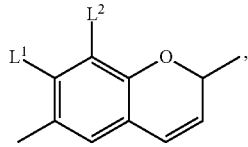

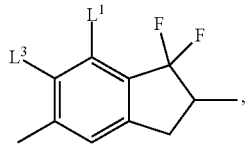

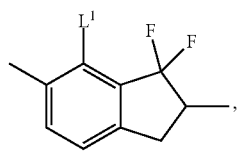

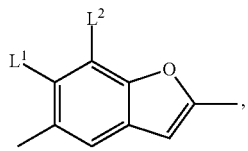

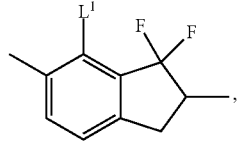

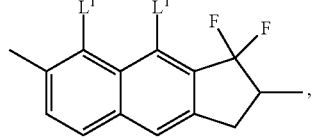

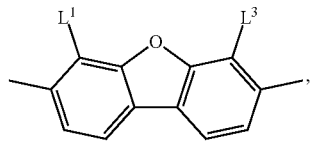

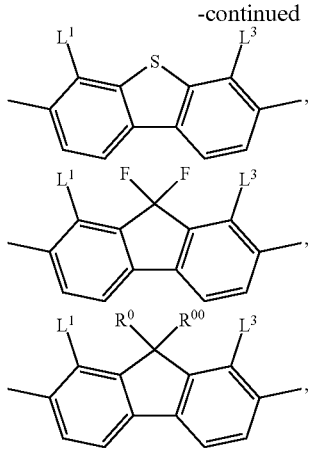

in which R⁰ and R⁰⁰ denote F or alkyl having 1 to 6 C atoms,

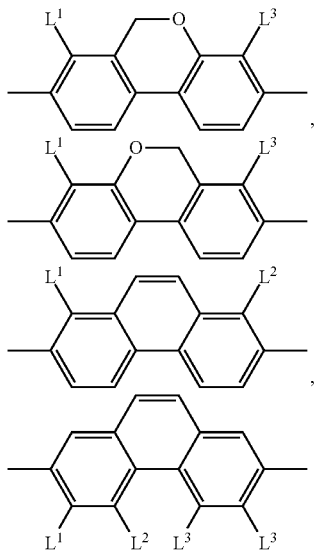

where the groups may be oriented in both directions,
L¹ to L³, independently of one another, denote F, Cl, Br, I, CN, SF₅, CF₃ or OCF₃, where L³ may alternatively also denote H,
Sp$^A$ denotes a spacer group or a single bond,
G denotes —OH, —CH(CH₂OH)₂, —C(CH₂OH)₃, —SH, —SO₂OH, —OP(O)(OH)₂, —PO(OH)₂, —C(OH)(PO(OH)₂)₂, —COOH, —Si(OR$^x$)₃, —SiCl₃, SO₂OR$^V$, —OP(O)(OR$^V$)₂, —PO(OR$^V$)₂, —C(OH)(PO(OR$^V$)₂)₂, —COOR$^V$ or —Si(OR$^V$)₃,
R$^V$ denotes secondary or tertiary alkyl having 1 to 20 C atoms,
R$^x$ denotes straight-chain or branched alkyl having 1 to 6 C atoms, and
r, s on each occurrence, identically or differently, are 0, 1 or 2,
wherein at least one of the groups Sp$^A$ and R$^{1A}$ is chiral.

17. The electronic switching device (100) according to claim 1, wherein compounds of formula IA are selected from compounds of sub-formulae IAa to IAf:

R¹—B¹-Sp-G    IAa

R¹-(A¹-Z¹)—B¹-Sp-G    IAb

R¹-(A¹-Z¹)₂—B¹-Sp-G    IAc

R¹—B¹—(Z²-A²)-Sp-G    IAd

R¹—B¹—(Z²-A²)₂-Sp-G    IAe

R¹-(A¹-Z¹)—B¹—(Z²-A²-)-Sp-G    IAf wherein
A¹ and A² denote

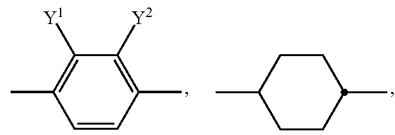

B¹ denotes

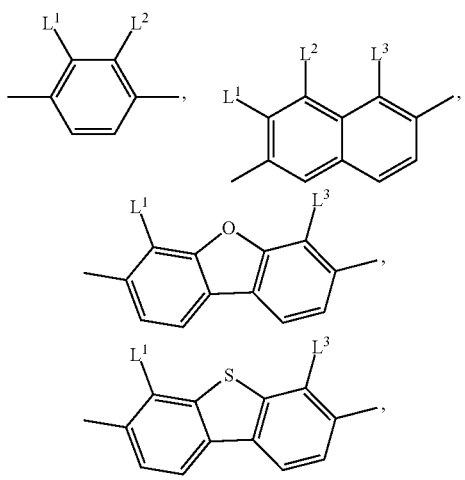

where the groups may be oriented in both directions,
R¹ denotes alkyl having 1-15 C atoms,
L¹ and L², independently of one another, denote CF₃, Cl, or F, where at least one of L¹ and L² denotes F,
L³ denotes F,
Y¹ and Y², independently of one another, denote CF₃, Cl, or F,
Z¹, Z², independently of one another, denote a single bond, —CF₂O—, —OCF₂—, —CH₂O—, OCH₂—, or —CH₂CH₂—,
Sp denotes unbranched 1,ω-alkylene having 1 to 12 C atoms,
G denotes —OH, —SH, —SO₂OH, —OP(O)(OH)₂, —PO(OH)₂, —COH(PO(OH)₂)₂, —COOH, —Si(OR$^x$)₃, or —SiCl₃
in which R$^x$ denotes methyl or ethyl.

18. The electronic switching device (100) according to claim 1, wherein compounds of formula IB are selected from compounds of sub-formulae IBa to IBf:

D¹-Z$^D$—B¹-Sp-G    IBa

D¹-Z$^D$-(A¹-Z¹)—B¹-Sp-G    IBb

D¹-Z$^D$-(A¹-Z¹)₂—B¹-Sp-G    IBc

D¹-Z$^D$—B¹—(Z²-A²)-Sp-G    IBd

D¹-Z^D—B¹—(Z²-A²)₂-Sp-G    IBe

D¹-Z^D-(A¹-Z¹)—B¹—(Z²-A²)-Sp-G    IBf wherein
A¹ and A² identically or differently, denote

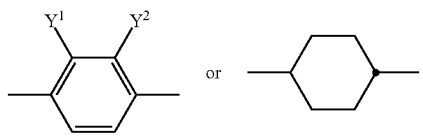

B¹ denotes

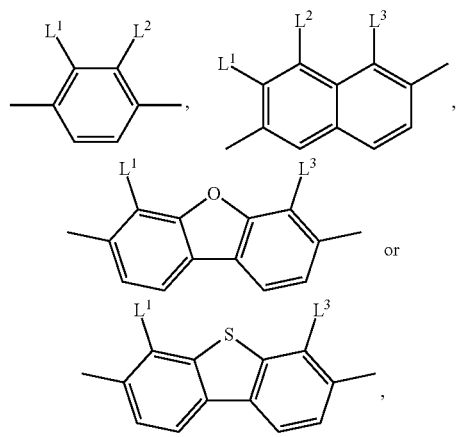

D¹ denotes adamantyl or diamantyl,

L¹ and L², independently of one another, denote CF₃, Cl or F, where at least one of L¹ and L² denotes F, L³ denotes F, Y¹ and Y², independently of one another, denote CF₃, Cl or F, Z^D denotes a single bond, —C≡C—, —C(O)O—, —OC(O)—, —OCH₂—, —CH₂O—, —CH₂CH₂—, —CH₂CH₂CH₂—, or —CH₂CH₂CH₂CH₂—, Z¹, Z², independently of one another, denote a single bond, —C(O)O—, —OC(O)—, —CF₂O—, —OCF₂—, —CH₂O—, —OCH₂—, or —CH₂CH₂—, Sp denotes unbranched 1,ω-alkylene having 1, 2, 3, 4, 5, 6, 7, 8, 9, 10, 11 or 12 C atoms, G denotes —OP(O)(OH)₂, —PO(OH)₂, or —COH(PO(OH)₂)₂.

19. The electronic switching device (100) according to claim 1, wherein compounds of formula IC are selected from compounds of sub-formulae IC-1 to IC-6:

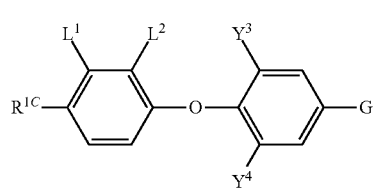

-continued

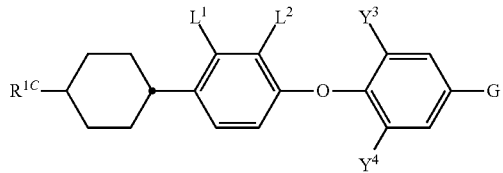

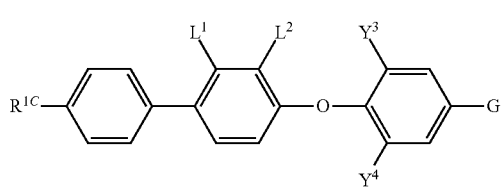

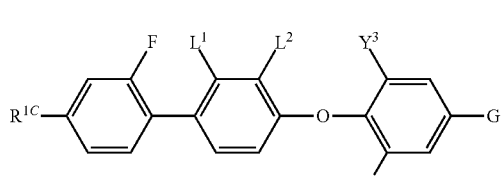

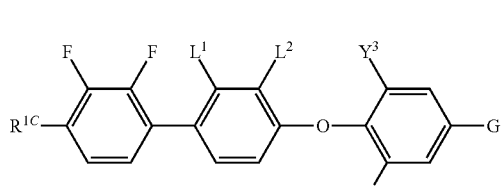

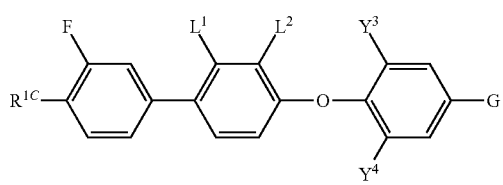

wherein
R^{1C} denotes H, straight chain or branched alkyl, alkenyl, alkynyl, alkoxy each having up to 12 C atoms, adamantly, or adamantylmethyloxy, L¹ and L² identically or differently, denote F, CF₃, or Cl, Y³ and Y⁴, identically or differently, methyl, ethyl, isopropyl, cyclopropyl, cyclobutyl, cyclopentyl, cyclopentenyl, cyclohexyl, cyclohexenyl, methoxy, trifluoromethyl, trifluoromethoxy, or trifluoromethylthio, and G denotes —PO(OH)₂, or —COH(PO(OH)₂)₂.

20. An electronic switching device (100) comprising, in this sequence,
a first electrode (102),
a molecular layer (103) bonded to the first electrode, and
a second electrode (104),
where the first and second electrodes comprise a metal nitride, and
where the molecular layer is formed from one or more compounds selected from formulae IBa to IBf and IC-1 to IC-6:

D¹-Z^D—B¹-Sp-G    IBa

D¹-Z^D-(A¹-Z¹)—B¹-Sp-G    IBb

D¹-Z^D-(A¹-Z¹)₂—B¹-Sp-G    IBc

D¹-Z^D—B¹—(Z²-A²)-Sp-G    IBd

D¹-Z^D—B¹—(Z²-A²)₂-Sp-G    IBe

D¹-Z^D-(A¹-Z¹)—B¹—(Z²-A²)-Sp-G    IBf

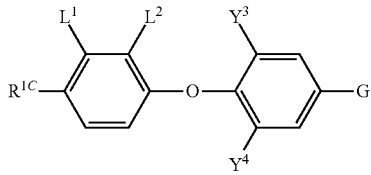

IC-1

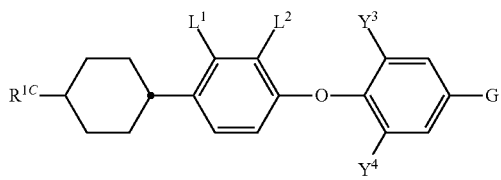

IC-2

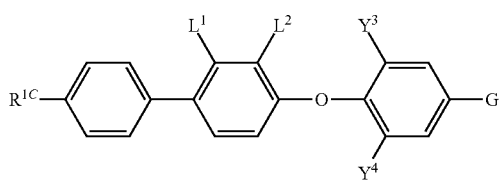

IC-3

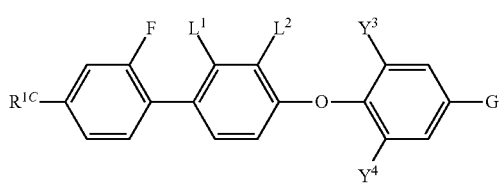

IC-4

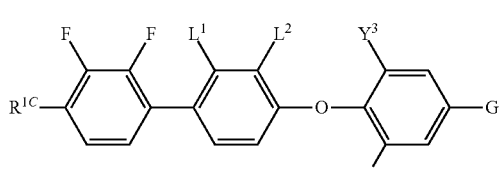

IC-5

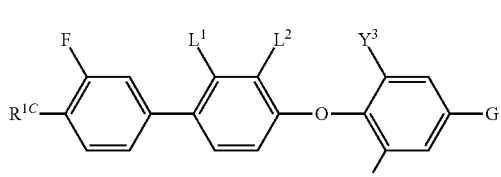

IC-6 wherein, in formulae IBa to IBf

A¹ and A² identically or differently, denote

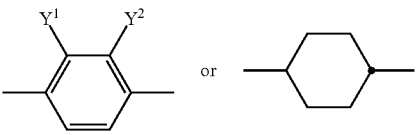

B¹ denotes

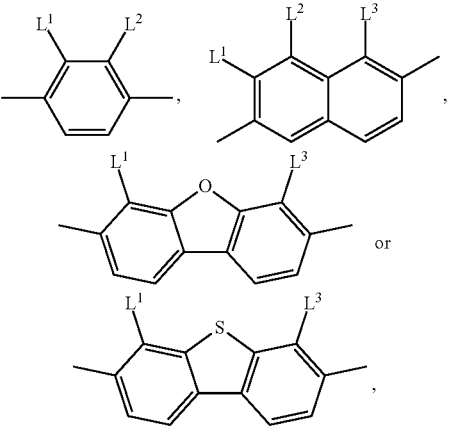

D¹ denotes adamantyl or diamantyl,
L¹ and L², independently of one another, denote CF₃, Cl or F, where at least one of L¹ and L² denotes F,
L³ denotes F,
Y¹ and Y², independently of one another, denote CF₃, Cl or F,
Z^D denotes a single bond, —C≡C—, —C(O)O—, —OC(O)—, —OCH₂—, —CH₂O—, —CH₂CH₂—, —CH₂CH₂CH₂—, or —CH₂CH₂CH₂CH₂—,
Z¹, Z², independently of one another, denote a single bond, —C(O)O—, —OC(O)—, —CF₂O—, —OCF₂—, —CH₂O—, —OCH₂—, or —CH₂CH₂—,
Sp denotes unbranched 1,ω-alkylene having 1, 2, 3, 4, 5, 6, 7, 8, 9, 10, 11 or 12 C atoms,
G denotes —OP(O)(OH)₂, —PO(OH)₂, or —COH(PO(OH)₂)₂; and
wherein formulae IC-1 to IC-6
R^{1C} denotes H, straight chain or branched alkyl, alkenyl, alkynyl, alkoxy each having up to 12 C atoms, adamantly, or adamantylmethyloxy,
L¹ and L² identically or differently, denote F, CF₃, or Cl,
Y³ and Y⁴, identically or differently, methyl, ethyl, isopropyl, cyclopropyl, cyclobutyl, cyclopentyl, cyclopentenyl, cyclohexyl, cyclohexenyl, methoxy, trifluoromethyl, trifluoromethoxy, or trifluoromethylthio, and
G denotes —PO(OH)₂, or —COH(PO(OH)₂)₂.

* * * * *